United States Patent [19]

Schouhamer Immink

[11] Patent Number: 5,696,505

[45] Date of Patent: Dec. 9, 1997

[54] METHOD OF CONVERTING A SERIES OF M-BIT INFORMATION WORDS TO A MODULATED SIGNAL, METHOD OF PRODUCING A RECORD CARRIER, CODING DEVICE, DECODING DEVICE, RECORDING DEVICE, READING DEVICE, SIGNAL, AS WELL AS RECORD CARRIER

[75] Inventor: Kornelis A. Schouhamer Immink, Eindhoven, Netherlands

[73] Assignee: U.S. Philips Corporation, Tarrytown, N.Y.

[21] Appl. No.: 385,533

[22] Filed: Feb. 8, 1995

[30] Foreign Application Priority Data

Feb. 15, 1994 [EP] European Pat. Off. .............. 94200387

[51] Int. Cl.[6] .................................................. H03M 7/00
[52] U.S. Cl. ........................................ 341/59; 341/95
[58] Field of Search .............................. 341/95, 58, 59, 341/106

[56] References Cited

U.S. PATENT DOCUMENTS

| | | | |
|---|---|---|---|
| 4,517,552 | 5/1985 | Shirota et al. | 340/347 |
| 4,520,346 | 5/1985 | Shimada | 340/347 |
| 4,683,572 | 7/1987 | Baggen et al. | 371/37 |
| 4,833,470 | 5/1989 | Iketani | 341/59 |
| 4,855,742 | 8/1989 | Verboom | 341/102 |
| 5,048,003 | 9/1991 | Baggen et al. | |

FOREIGN PATENT DOCUMENTS 0319101 6/1989 European Pat. Off. ........ G11B 20/14
0392506A2 10/1991 European Pat. Off. ........ G11B 20/14

*Primary Examiner*—Brian K. Young
*Assistant Examiner*—Peguy JeanPierre
*Attorney, Agent, or Firm*—Richard A. Weiss

[57] ABSTRACT

A a series of m-bit information words is converted to a modulated signal. For each information word from the series, an n-bit code word is delivered. The delivered code words are converted to the modulated signal. The code words are distributed over at least one group of a first type and at least one group of a second type. When a code word belonging to a group of the first type is delivered, its group establishes a coding state of a first type. When a code word belonging to an group of the second type is delivered, a coding state of a second type is established which is determined by the information word which is to be converted to the delivered code word. When one of the code words is assigned to the received information word, this code word is selected from a set of code words which depends on the coding state established. The sets of code words belonging to the coding states of the second type are disjunct. In this coding method, the number of unique bit combinations that may be established by the code words in the series are enlarged.

The modulated signal obtained may be reconverted to information words by first converting the modulated signal to a series of code words and then assigning an information word to each of the code words from the series in dependence on the code word to be converted and also in dependence on the logical values of the bit string bits which are situated at predetermined positions relative to the code word.

38 Claims, 20 Drawing Sheets

|     | $v_1$ | | $v_2$ | | $v_3$ | | $v_4$ | |
| --- | --- | --- | --- | --- | --- | --- | --- | --- |
| 248 | 0001001000001001 | 1 | 0100000100000010 | 1 | 0001001000001001 | 1 | 0100000100000010 | 1 |
| 249 | 0001001000010010 | 1 | 0001001000010010 | 1 | 1001000010010001 | 1 | 1001000010010001 | 1 |
| 250 | 0010000010000001 | 1 | 0010010010000001 | 1 | 1001000100100001 | 1 | 1001001001000001 | 1 |
| 251 | 0010001000000010 | 1 | 0010010000000010 | 1 | 1001001001000001 | 1 | 1001001001000001 | 1 |
| 252 | 0010010000001001 | 1 | 0100001000010010 | 1 | 0010010100000001 | 1 | 0100010010000001 | 1 |
| 253 | 0010010000010010 | 1 | 0010010000010010 | 1 | 0100001000001001 | 1 | 0100010000010001 | 1 |
| 254 | 0000000010000100 | 2 | 0100010000010001 | 1 | 1000000010000100 | 2 | 0100010000010001 | 1 |
| 255 | 0000000100100100 | 2 | 0100100000100010 | 1 | 1000000100100100 | 2 | 0100100000100010 | 1 |

| IW | SW | LB | OSV | CW | CS | dOSV | DSVN | LBN | SWN |
|---|---|---|---|---|---|---|---|---|---|
| "Z" | S1 | H | 0 | 0 1 0 0 1 1 0 0 0 0 1 0 0 0 1 0 0 | * | -6 +10 | -6 +10 | 1 0 | S2 S4 |
| "8" | S2 | L | -6 | 0 0 0 0 1 1 0 1 0 0 0 0 0 1 0 1 0 | * | -6 +12 | 0 -18 | 1 0 | S3 S3 |
| "100" | S3 | H | 0 | 1 0 0 1 0 1 0 0 0 0 1 1 0 0 1 0 1 | * | -2 | -2 | 0 | S1 |
| "230" | S1 | H | -2 | 0 0 0 0 0 0 1 0 0 1 0 0 0 1 0 0 0 | * | +2 | 0 | 0 | S4 |
| "0" | S4 | H | 0 | 0 1 0 1 0 0 1 0 1 0 0 0 0 0 1 1 0 | * | -8 +4 | -8 +4 | 1 0 | S2 S2 |
| "19" | S2 | H | +4 | 1 0 0 1 0 0 1 0 0 1 0 0 1 0 1 0 0 | * | -2 +3 | +2 +7 | 0 1 | S1 S2 |
| "215" | S1 | H | +2 | 0 0 1 0 0 0 1 0 0 0 1 0 0 0 0 0 0 | * | +4 | +6 | 1 | S1 |

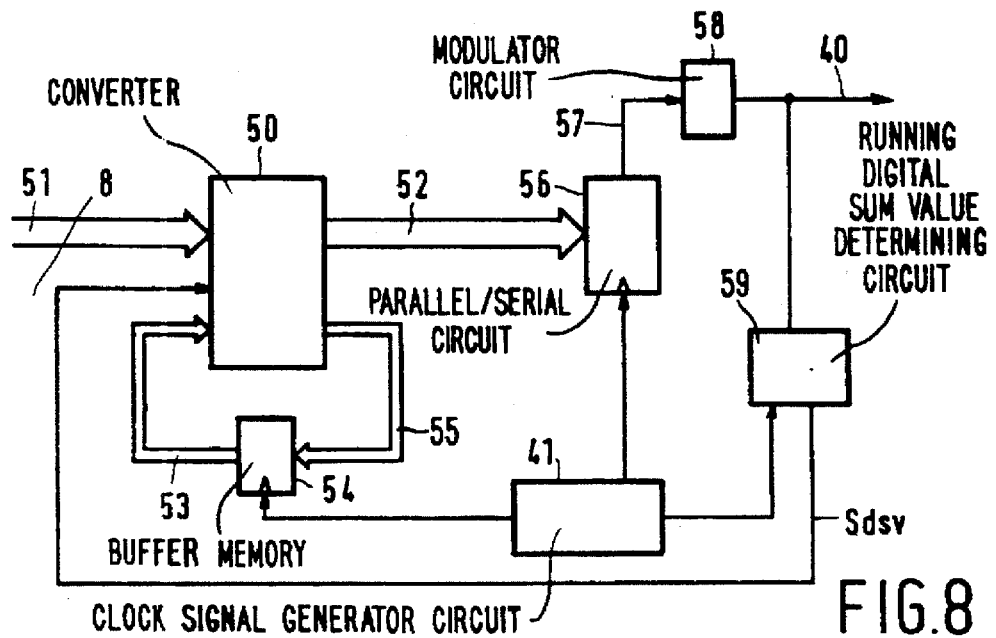
FIG.8
X1 · · · · · · · · · X13 · · · · · · · · · · X26
1 0 0 1 0 0 0 0 0 0 0 0 1 0 0 0 0 0 0 0 0 0 0 0 0 1 — 100
0 0 0 1 0 0 0 0 0 0 0 0 1 0 0 0 0 0 0 0 0 0 0 0 0 1 — 101
FIG.9
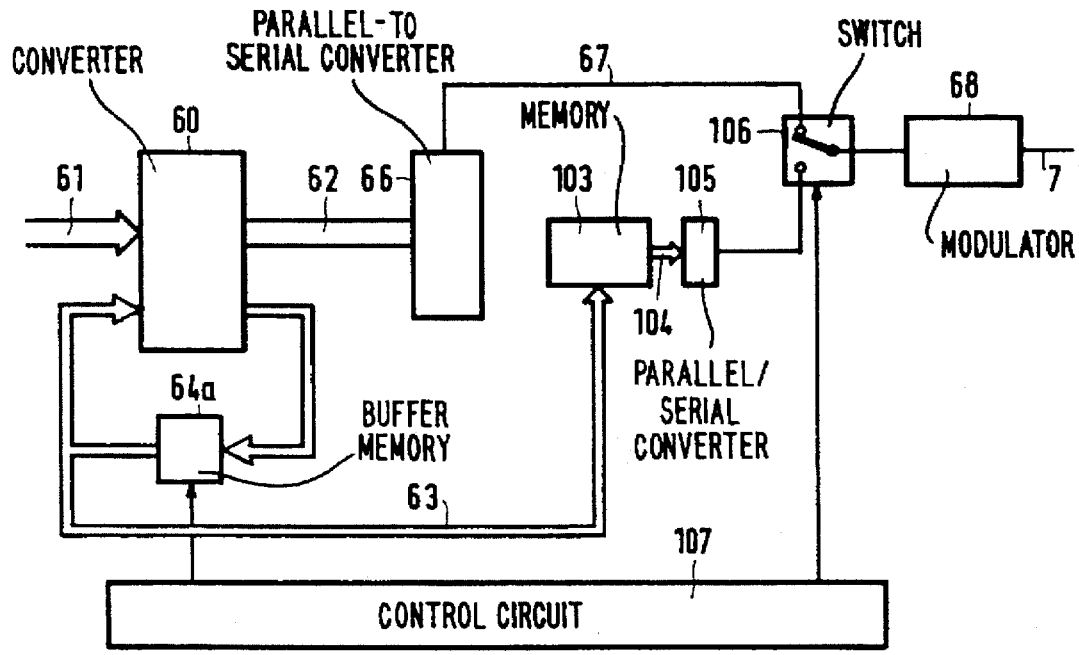
FIG.10

METHOD OF CONVERTING A SERIES OF M-BIT INFORMATION WORDS TO A MODULATED SIGNAL, METHOD OF PRODUCING A RECORD CARRIER, CODING DEVICE, DECODING DEVICE, RECORDING DEVICE, READING DEVICE, SIGNAL, AS WELL AS RECORD CARRIER

BACKGROUND OF THE INVENTION

The invention relates to a method of converting a series of m-bit information words to a modulated signal, with m being an integer. In such a method, an n-bit code word is delivered for each received information word, with n being an integer exceeding m, and the delivered code words are converted to the modulated signal, and in which the series of information words is converted to a series of code words according to rules of conversion so that the corresponding modulated signal satisfies a predetermined criterion.

The invention further relates to a method of producing a record carrier on which the modulated signal obtained according to the method is recorded.

The invention further also relates to a coding device for performing the method. The device comprising an m-to-n bit converter for converting the m-bit information words to n-bit code words, and a unit for converting the n-bit code words to a modulated signal.

The invention still further relates to a recording device in which the coding device is used.

The invention further more relates to the modulated signal.

In addition invention relates to a record carrier on which the modulated signal is recorded.

The invention further relates to a decoding device for converting the modulated signal to a series of m-bit information words. That device comprises a converting unit for converting the signal to a bit string of bits having a first or second logical value, which bit string contains a series of n-bit code words which correspond to the information signal portions, and another converting unit for converting the series of code words to the series of information words, with a code word-dependent information word being assigned to each of the code words to be converted.

Finally, the invention relates to a reading device in which the decoding device is used.

Such methods, such devices, such a record carrier and such a signal are described by K. A. Schouhamer Immink in the book entitled "Coding Techniques for Digital Recorders" (ISBN 0-13-140047-9). In that book, for example, the so-called EFM modulation system is described which is used for recording information on so-called Compact Discs. The EFM-modulated signal is obtained by converting a series of 8-bit information words to a series of 14-bit code words, three merging bits being inserted into the code words. The code words are selected such that the minimum number of "0" bits situated between the "1" bits is d (2) and the maximum number is k (10). This constraint is also know as the dk-constraint. The series of code words is converted, via a modulo-2 integration operation, to a corresponding signal formed by bit cells having a high or low signal value. A "1"-bit is represented in the modulated signal by a change from the high to the low signal value or vice versa. A "0"-bit is represented by the lack of a change of signal value at a transition between two bit cells. The merging bits are selected such that even in the regions of transition between two code words the dk-constraint is satisfied and in the corresponding signal, the so-called running digital sum value remains substantially constant. The running digital sum value at a specific instant as used herein means the difference between the number of bit cells having the high signal value and the number of bit cells having the low signal value, calculated over the modulated signal portion situated before this instant. A substantially constant running digital sum value means that the frequency spectrum of the signal does not comprise frequency components in the low frequency area. Such a signal is also referenced a DC-free signal. The lack of low-frequency components in the signal is highly advantageous when the signal is read from a record carrier on which the signal is recorded in the track, because continuous tracking control unaffected by the recorded signal is possible. Information recording has a constant need for enhancing the information density on the record carrier.

SUMMARY OF THE INVENTION

A possible solution to this is a reduction of the number of bit cells per information word in the modulated signal. However, a reduction of the number of bit cells per information word results in the number of unique bit combinations which may represent the information words to decrease. This in turn means less strict constraints can be imposed on the modulated signal, for example, constraints pertaining to low-frequency contents of the modulated signal.

It is an object of the invention to provide means for reducing the number of bit cells per information word and counteracting the reduction of the number of unique bit combinations.

According to a first aspect of the invention this object is achieved with a method as defined in the opening paragraph, characterized in that the code words are spread over at least one group of a first type and at least one group of a second type, where the delivery of each of the code words belonging to a group of the first type establishes a first type of coding state determined by the associated group, and the delivery of each of the code words belonging to a group of the second type establishes a second type of coding state determined by the information word associated with the delivered code word. Further, when one of the code words is assigned to the received information word, this code word is selected from a set of code words that depends on the coding state established when the preceding code word was delivered, where the sets of code words belonging to the coding states of second type do not have code words in common.

According to a second aspect of the invention, a coding device of the type described above is characterized in that it comprises state establishing means for establishing a coding state on the delivery of a code word by the converter, the state establishing means being arranged for establishing a first type of coding state for each of the delivered code words belonging to a group of the first type, which state is determined by the associated group, and for establishing a second type, of coding state for each of the delivered code words belonging to a group of the second type, which state is determined by the information word associated to the delivered code word; and the m-to-n-bit converter comprising means for selecting a code word corresponding to the information word from a selection of code words that depends on the coding state, sets of code words belonging to coding states of the second type not containing any code words in common.

In the method and coding device according to the invention, the combination of the same code word with code words from disjunct sets of code words (=sets without common code words) establishes various unique bit combinations, so that more than one information word can be uniquely represented by the same code word in combination with the successive code word. The code word from the group of the second type is always followed for that matter by a code word of which it is always possible to establish unambiguously to what set this next code word belongs. It is then possible with the code words from each of the disjunct sets always to establish a sufficient number of unique bit combinations to represent all the information words.

These measures provide a possibility of establishing a large number of unique bit combinations with code words having a relatively small number of bits per code word. In the case where the code words are selected to be spread over the sets and groups so that the number of unique bit combinations exceed the number of different information words, it is possible to use the remaining bit combinations for influencing predetermined properties of the modulated signal.

It is alternatively possible to use only as many bit combinations as there are information words. In that case the remaining bit combinations allow specific additional requirements to be made on the code words.

For one or more sets, however, there is a preference to assign a pair of code words from the associated set to each of a number of information words, and then, on conversion, to select either of the available code words from the pair according to a specific criterion so as to influence a specific property of the modulated signal. A method in which this is realised is characterized in that a series of information words is converted according to rules of conversion to a series of code words so that the corresponding modulated signal presents substantially no frequency components in a low-frequency area in the frequency spectrum and the modulated signal is any number of successive bit cells having the same minimum signal value d+1 and maximum signal value k+1. The sets of code words contain a pair of code words for each one of at least a number of information words, whereby the low-frequency components in the modulated signal are avoided by making selections of code words from the pairs of code words when the information words are converted.

This embodiment is advantageous in that, despite the reduction of the number of bit cells per information word, the presence of low-frequency components in the modulated signal can be largely avoided.

A further embodiment is characterized in that synchronization (sync) words are inserted into the series of code words, the sync words showing bit patterns that cannot occur in the bit string formed by the code words. Sync words are used which have different bit patterns, and the sync word used depends on the coding state. A predetermined coding state is established for the conversion of the next information word after a sync word has been inserted, and the sync words are mutually distinguishable on the basis of the logical values of bits at predetermined bit positions in a manner corresponding to the manner in which the sets of code words belonging to coding states of the second type are mutually distinguishable.

This embodiment is advantageous in that in the case where a code word of the group of the second type is followed by a sync word, an information word is established by a bit combination formed by the code word and sync word similarly to the case where the code word of the group of the second type would be followed by a code word.

This embodiment is also advantageous in that a coding state is established each time after a sync word has been delivered, so that the constraints imposed on the bit string at the transition from sync word to the next code word can always be satisfied.

The signal obtained by the coding device according to the invention is advantageous in that it can be decoded in an extremely simple manner.

An embodiment for a decoding device of the type described above by which this is realised is characterized in that the converting unit is arranged for converting a code word to an information word also in dependence on the logical values of bits in the bit string located at predetermined positions with respect to the code word.

BRIEF DESCRIPTION OF THE DRAWINGS

The invention will be further explained with reference to the following drawings in which:

Figure 2A:
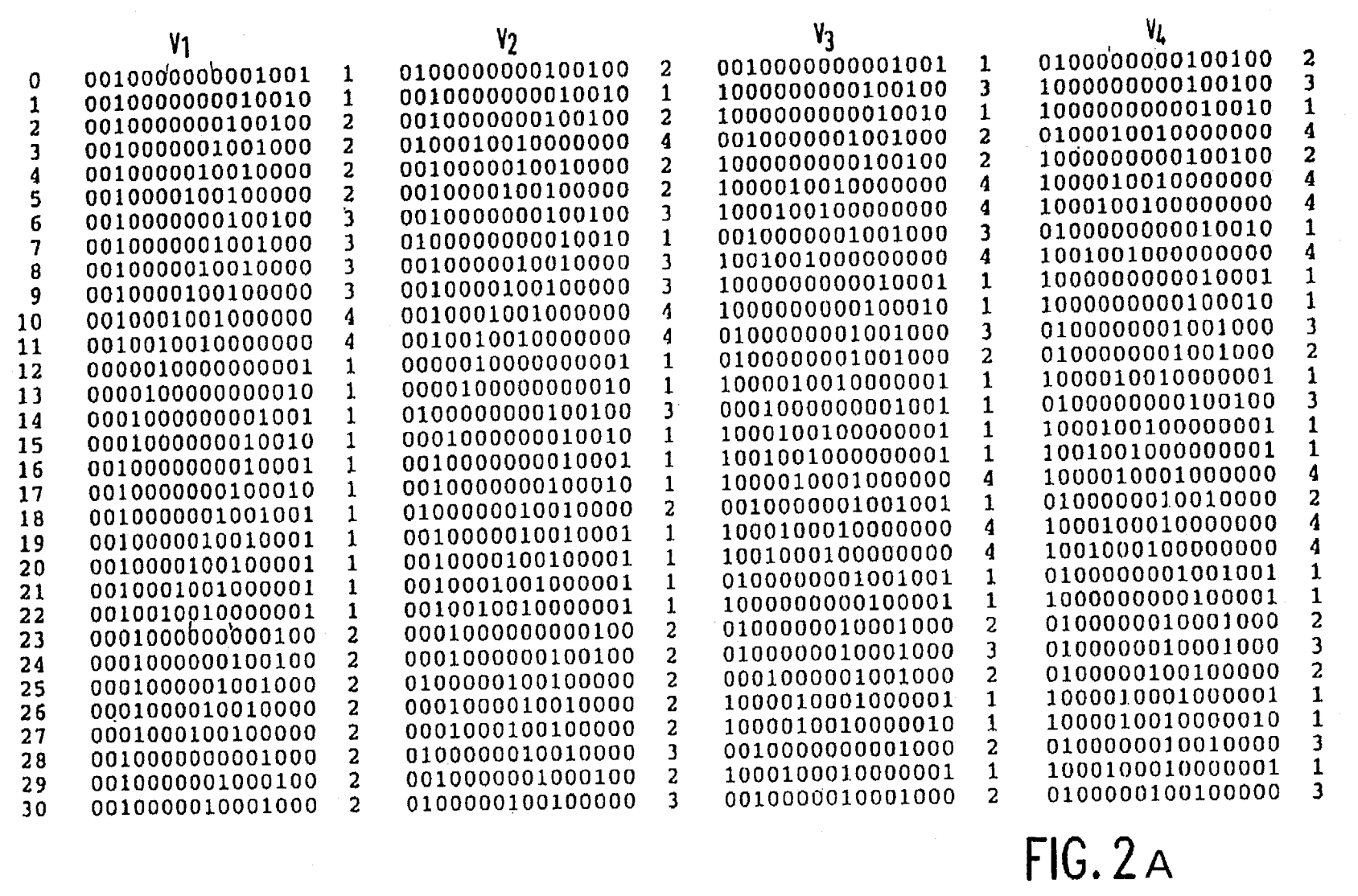
Figure 2B:
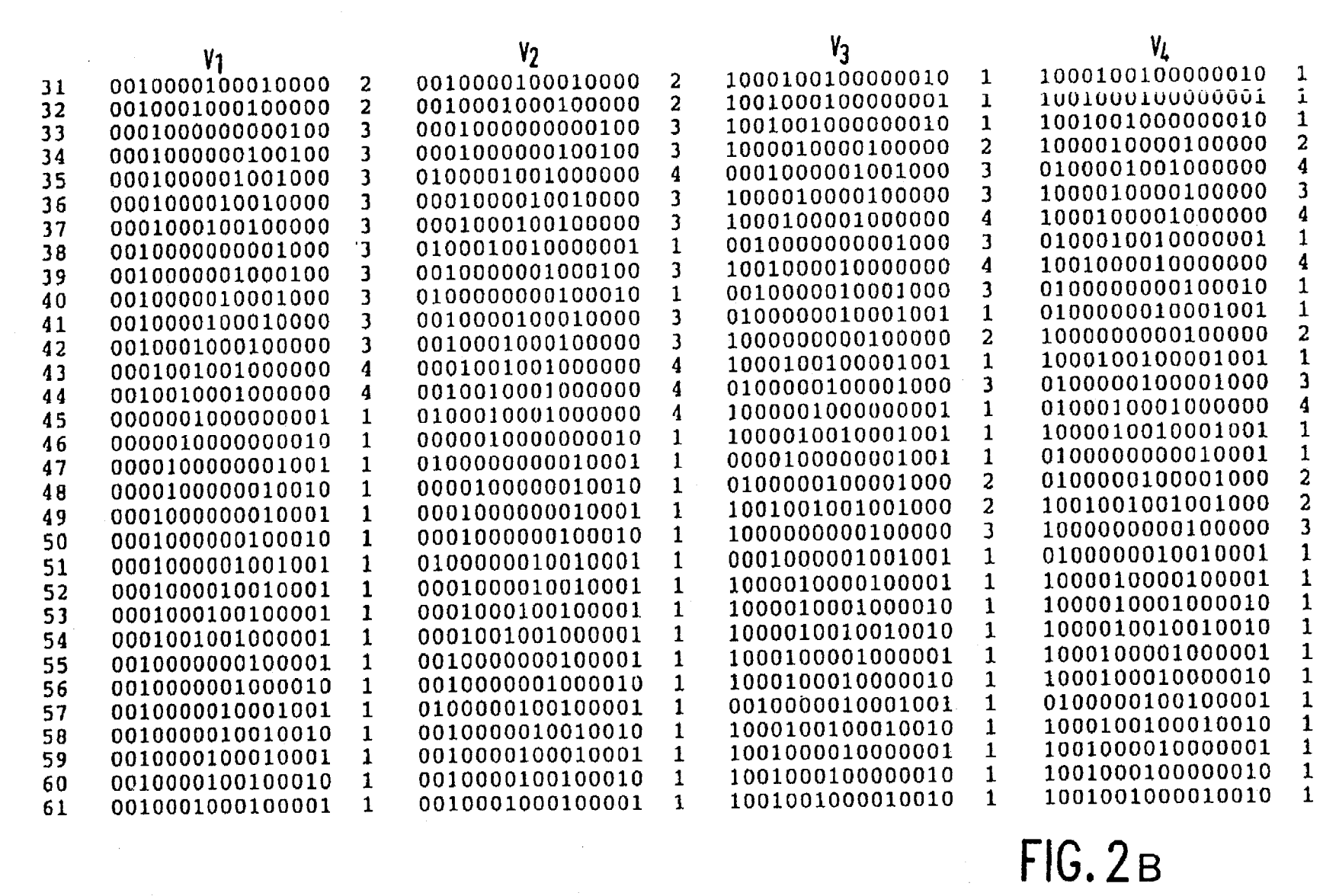
Figure 2C:
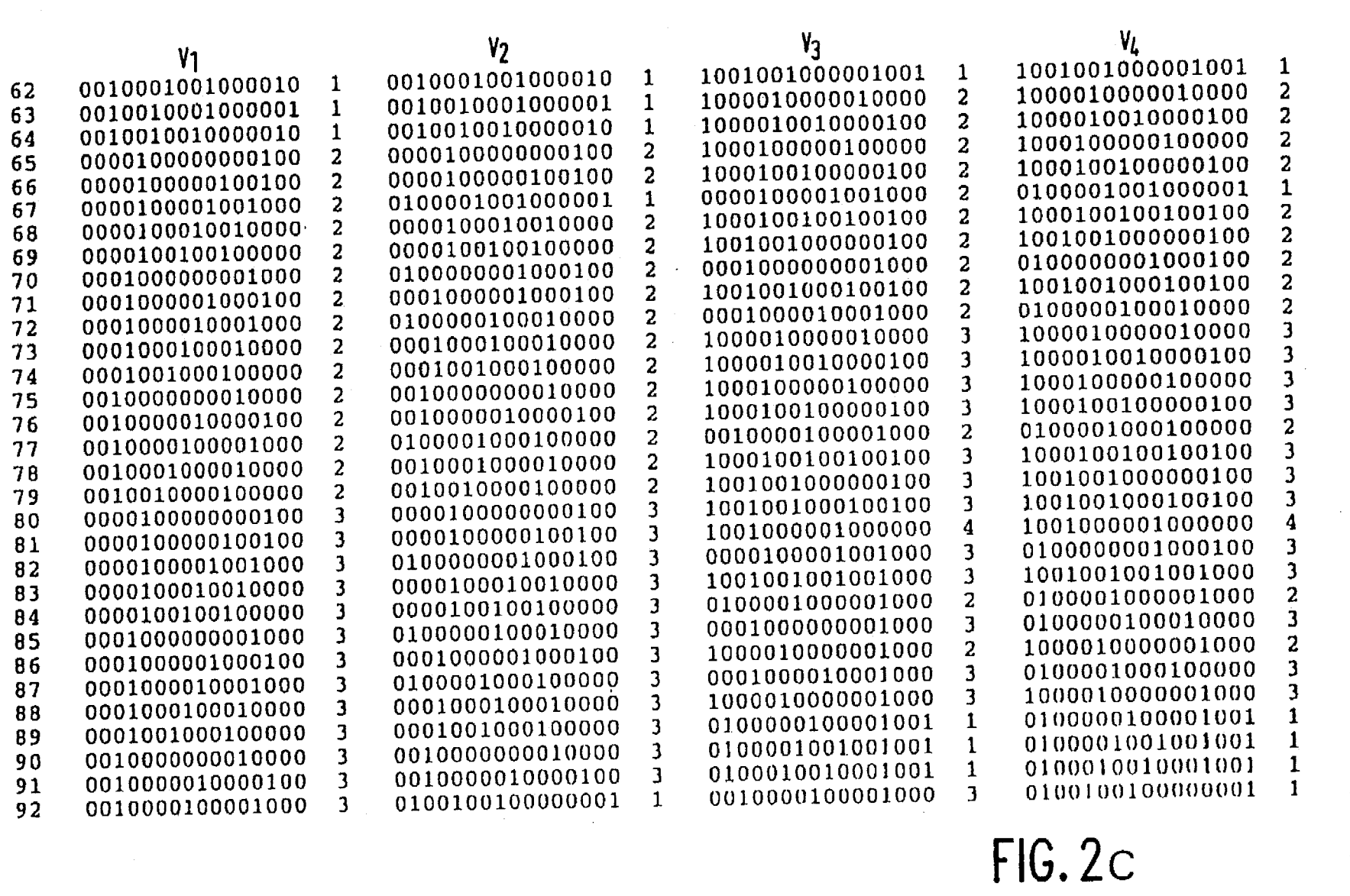
Figure 2D:
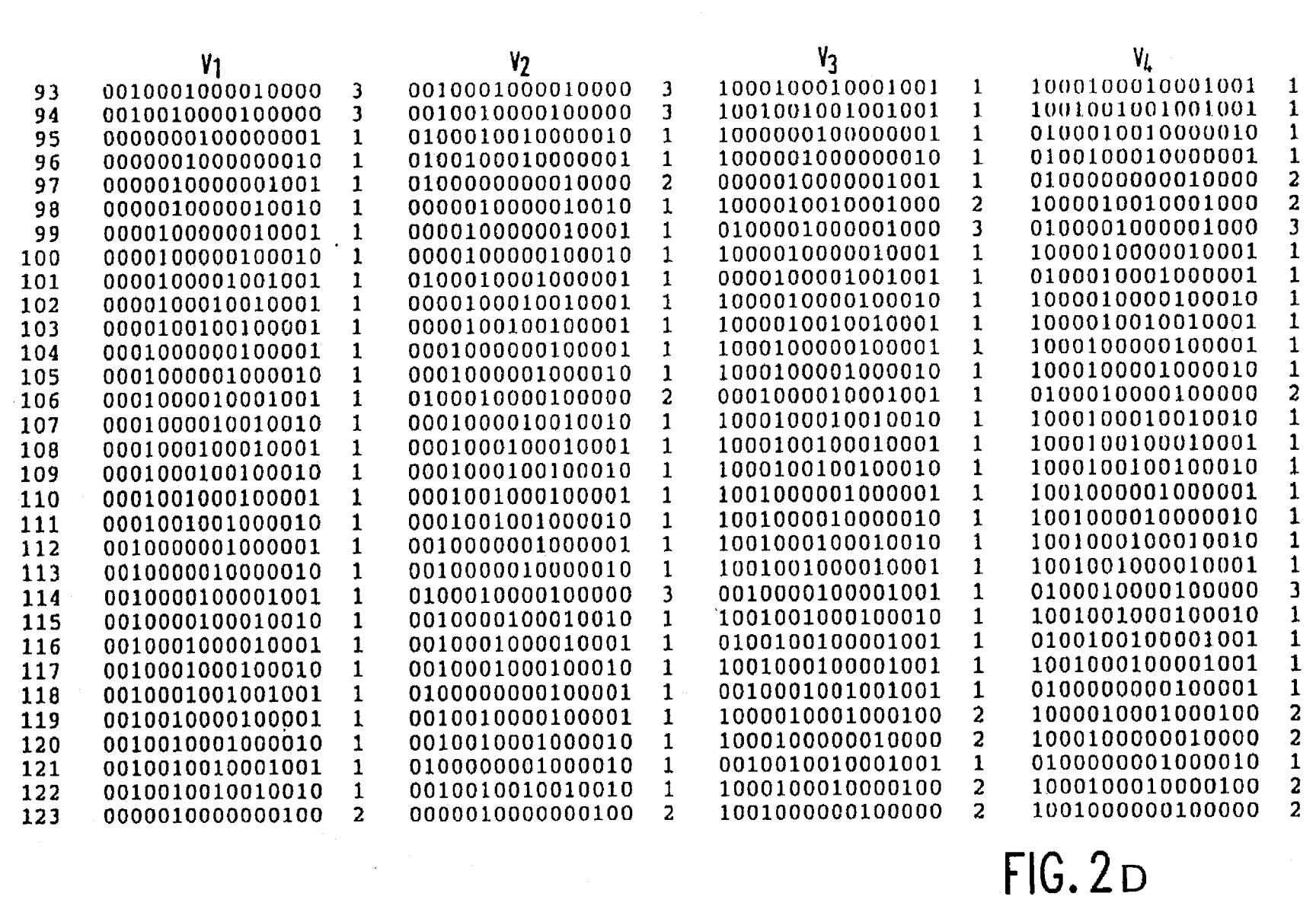
Figure 2E:
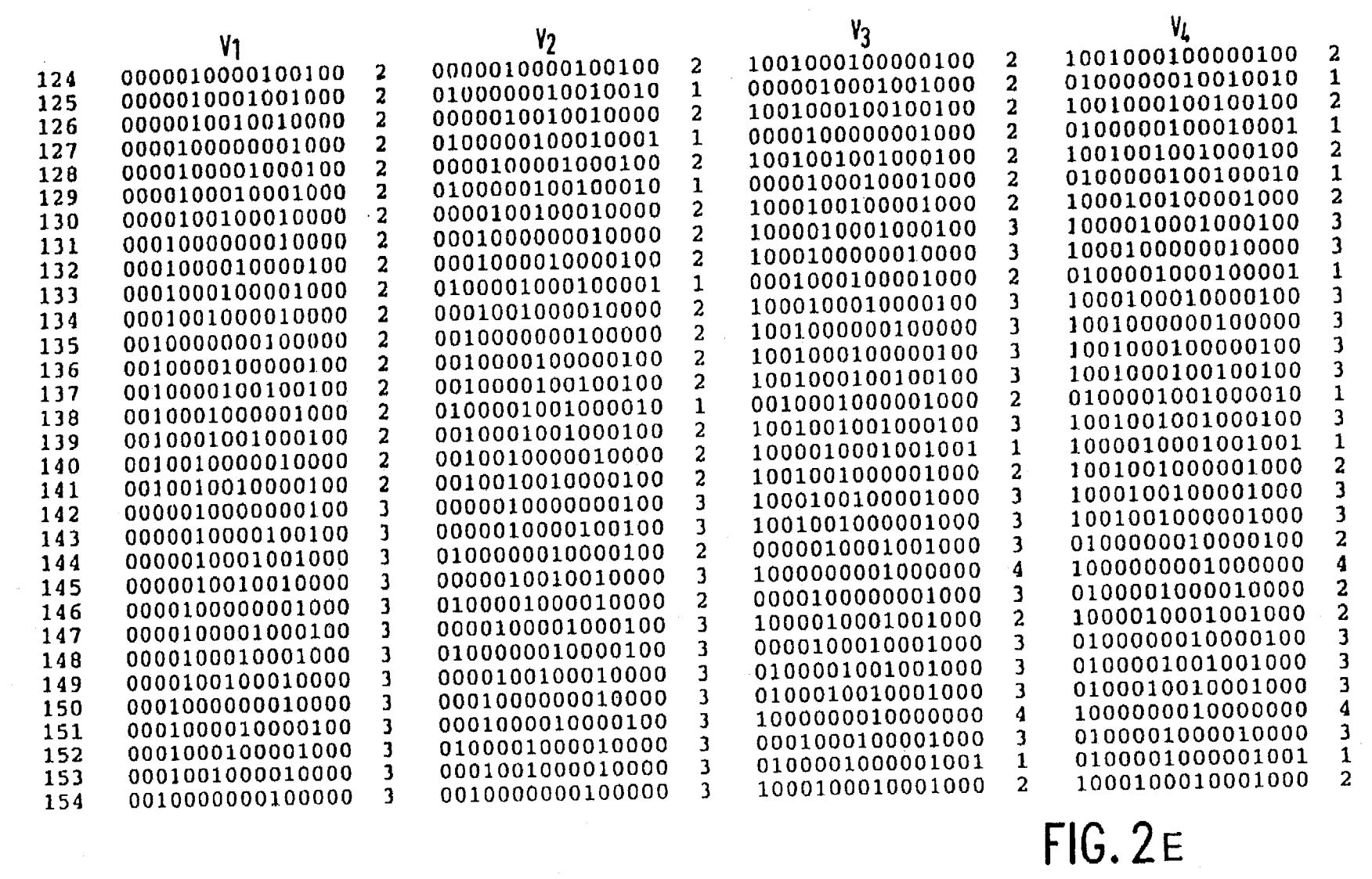
Figure 2F:
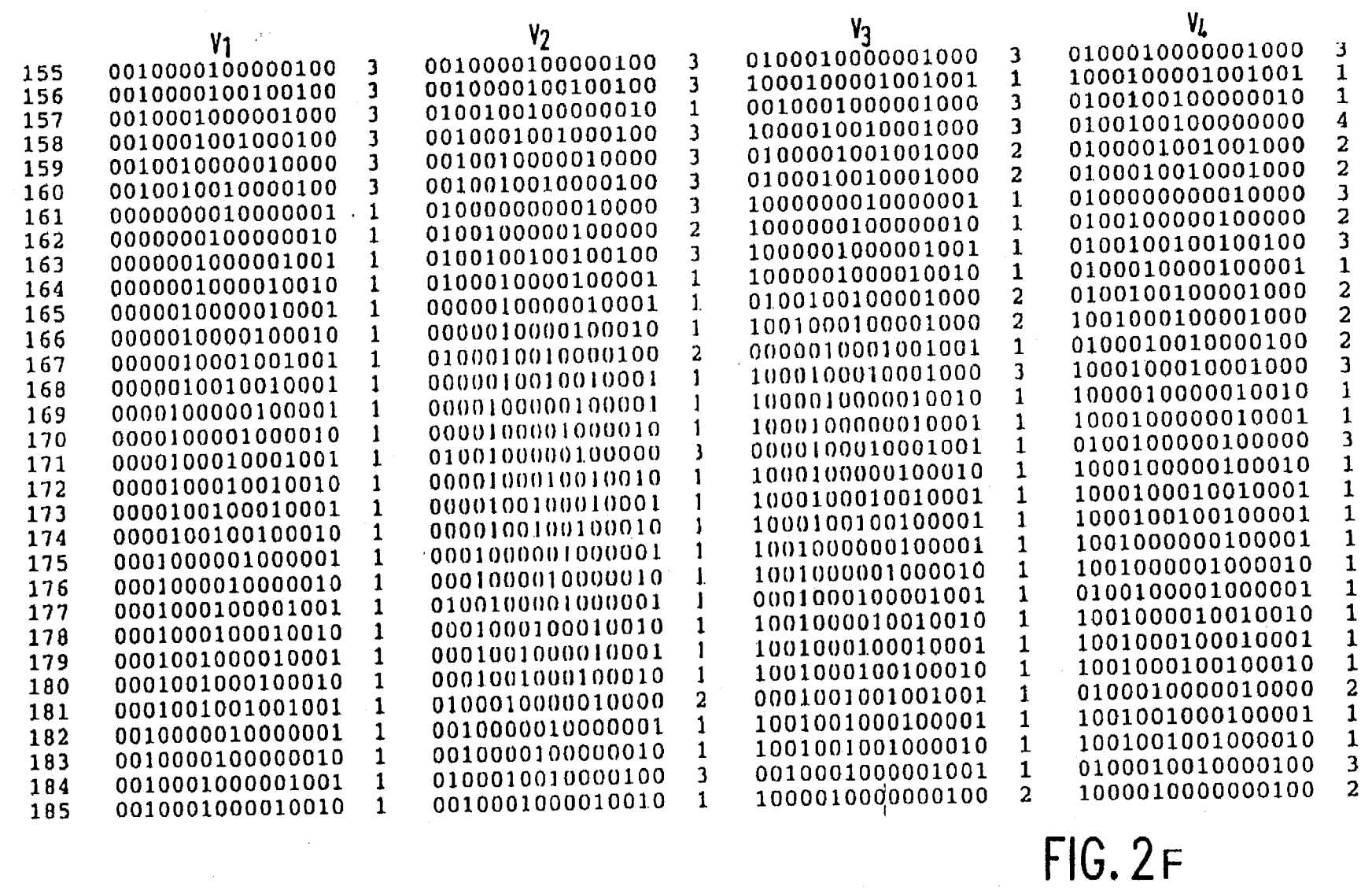
Figure 2G:
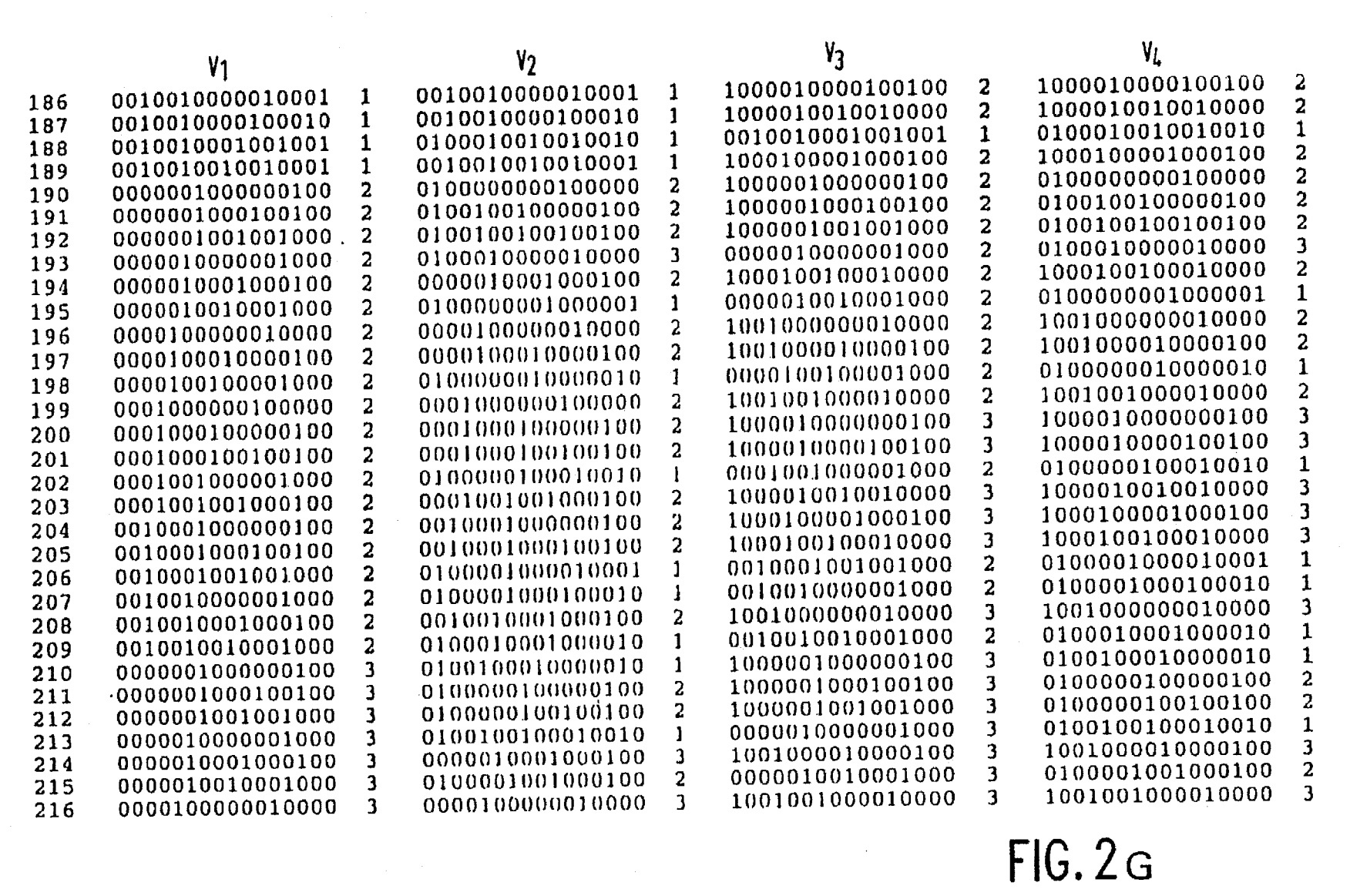
Figure 2H:
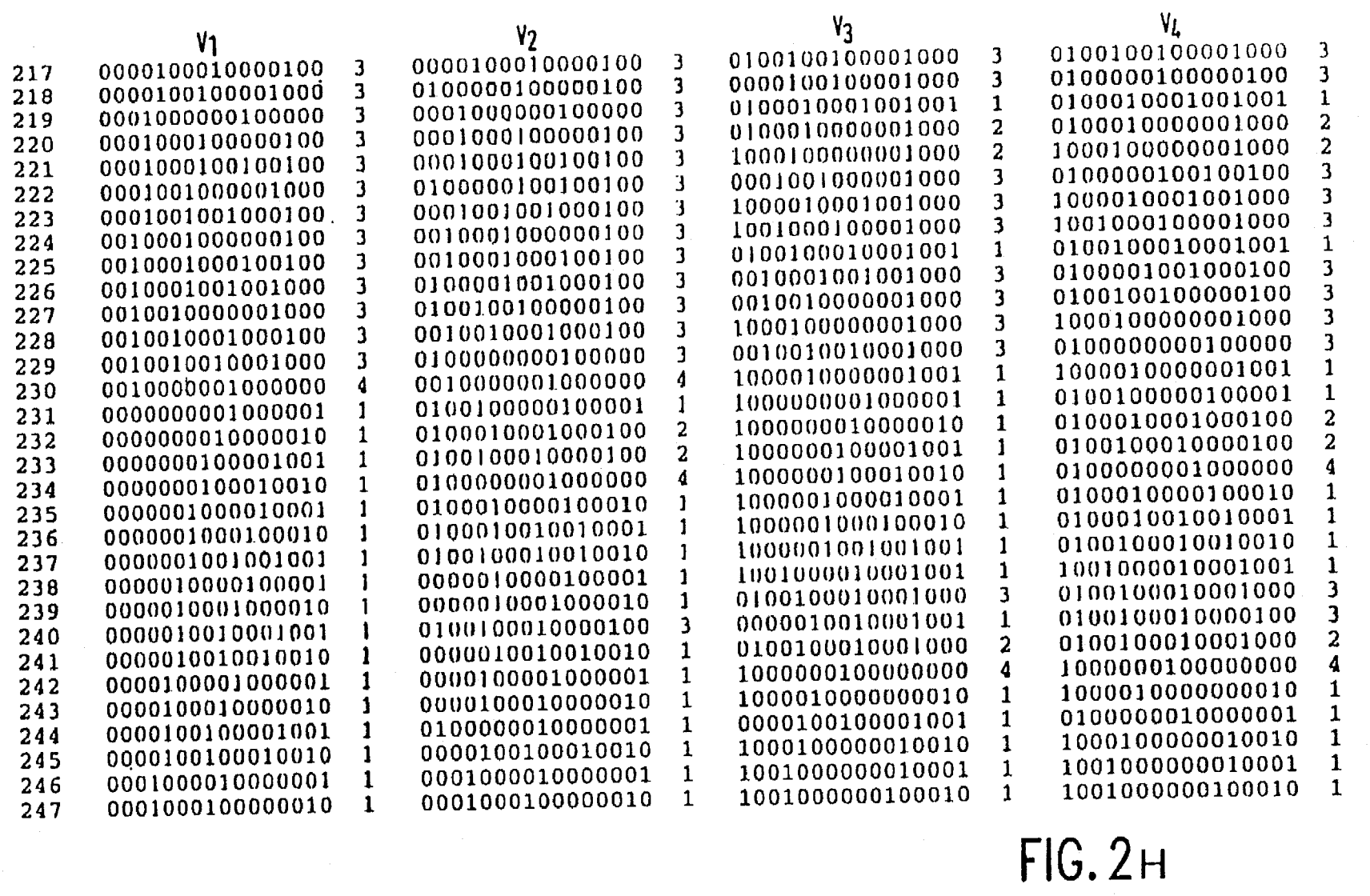

FIGS. 2A–J, and 3A–C show tables in which the relation between the information words and code words is established;

FIG. 4 shows the values of various parameters as they are when a series of information words is converted to a series of code words;

FIGS. 6 and 8 show various embodiments of coding devices in accordance with the invention;

FIG. 9 shows possible bit patterns of suitable sync words;

FIG. 10 shows an adaptation of the coding device of FIG. 6 for the insertion of sync words;

DESCRIPTION OF THE PREFERRED EMBODIMENTS

Figure 1:
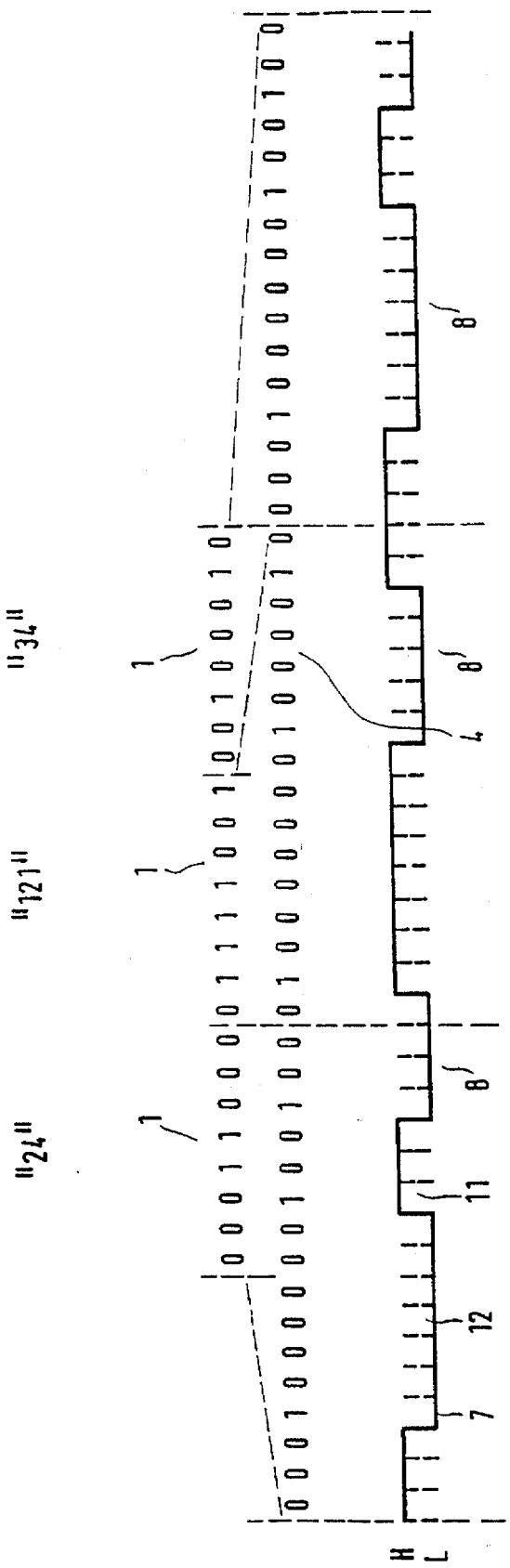
FIG. 1 shows a series of information words, a corresponding series of code words and a modulated signal.

FIG. 1 shows three consecutive m-bit information words, in this case, 8-bit information words referenced 1. The three information words 1 have the respective word values "24", "121" and "34". This series of 3 information words 1 is converted to three consecutive n-bit code words, in this case, 16-bit code words referenced 4. The code words 4 form a bit string of bits having a logical "0" value and bits having a logical "1" value. The conversion of the information words is such that in the bit string the minimum number of bits having a logical "0" value positioned between two bits having a logical "1" value is d and the maximum is k, where d is equal to 2 and k is equal to 10. Such a bit string is often referenced a RLL string (RLL=Run Length Limited) with a dk-constraint. The individual bits of the code words will further be referenced x1, ..., x16, where x1 denotes the first bit (from the left) of the code word and x16 denotes the last bit of the code word.

The bit string formed by the code words 4 is converted to a modulated signal 7 by means of a modulo-2 integration operation. This modulated signal comprises three information signal portions 8 representing the code words 4. The information signal portions comprise bit cells 11 which may have a high signal value H or a low signal value L. The number of bit cells per information signal portion is equal to the number of bits of the associated code word. Each code word bit having a logical "1" value is indicated in the modulated signal 7 by a transition from a bit cell having the high signal value to a bit cell having the low signal value, or vice versa. Each code word bit having the logical "0" value is indicated in the modulated signal 7 by the absence of a change of signal value at a bit cell transition.

The frequency spectrum of the modulated signal 7 is required to include substantially no low-frequency components. Worded differently, the modulated signal 7 is to be DC-free.

Hereinafter, an embodiment of the method according to a invention by which the modulated signal can be obtained is described in detail.

Figure 17:
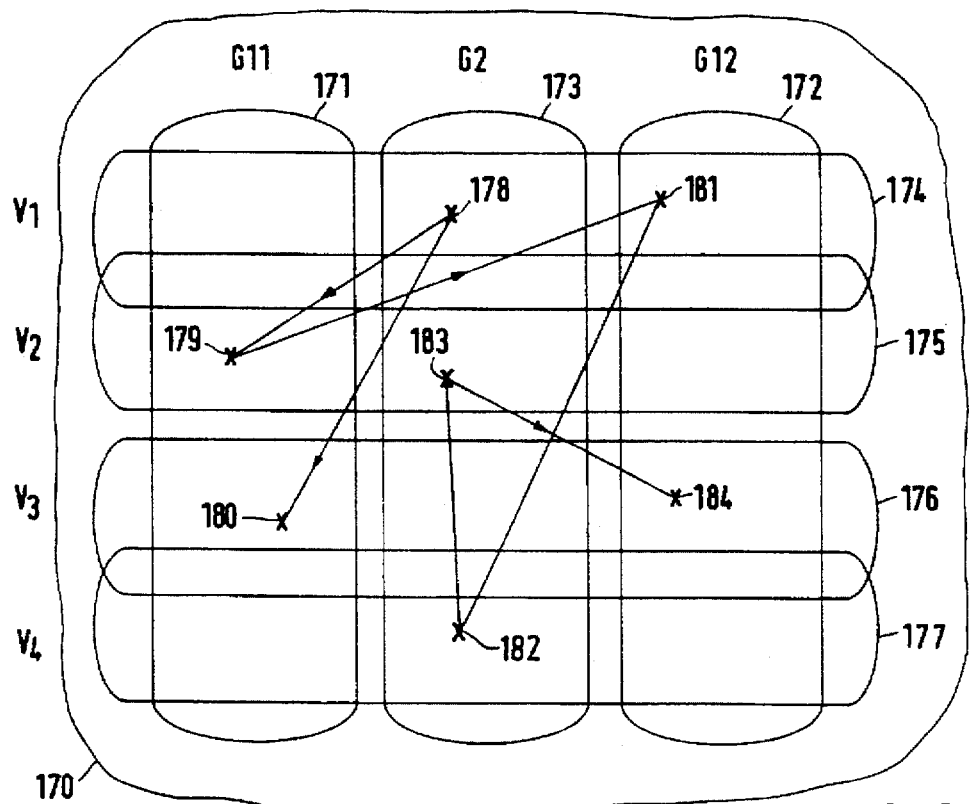
FIG. 17 shows a diagrammatic representation of the spreading of code words over groups and sets.

There is a requirement with respect to the code words that within the code words the dk-constraint be satisfied. FIG. 17 diagrammatically shows the set of all the possible code words satisfying the dk-constraint in the zone enclosed by frame 170. The code words are divided into at least a group of a first type and at least a group of a second type. When a code word is delivered from one of the groups of the first type, a coding state is established which exclusively depends on the group of the first type to which the delivered code word belongs. When one of the code words of the group of the second type is delivered, a coding state is established which depends both on the group of the second type and on the information word represented by the delivered code word.

In the embodiment described herein, two groups of the first type can be distinguished, i.e., a first group G11 which comprises code words ending in a bits having a logical "0" value, where a is an integer equal to 0, or 1, and a second group G12 of code words ending in b bits having a logical "0" where b is an integer smaller than or equal to 9 and greater than or equal to 6.

In FIG. 17, the code words belonging to group G11 lie in a frame 171. The code words belonging to group G12 lie in a frame 172.

The coding state established by the first group G11 of the first type will hereinafter be referenced S1. The coding state established by the second group G12 of the first type will henceforth be referenced S4.

The embodiment described herein only has one group of the second type. This group comprises code words ending in c bits having a logical "0" value, where c is an integer greater than or equal to 2 and smaller than or equal to 5. This group will henceforth be referenced group G2. In FIG. 17, the code words of group G2 lie in a frame 173. In the example to be described herein, two coding states, i.e., S2 and S3 can be established by the combination of a code word and an associated information word.

When the information words are converted to code words, a code word belonging to a set of code words depending on the coding state is assigned to the information word to be converted. The sets of code words belonging to the coding states S1, S2, S3 and S4 will henceforth be referenced V1, V2, V3 and V4, respectively. The code words of the sets V1, V2, V3 and V4 lie in the frames 174, 175, 176 and 177. The code words in the sets are selected such that each bit string that can be formed by a code word from the group that has established a coding state and an arbitrary code word from the set established by this coding state satisfies the dk-constraint. In the case where the coding state S4 is established by the delivery of the previously delivered code word, which coding state denotes that the previous code word ends in a bit string having a logical "0" value greater than or equal to 6 and smaller than or equal to 9, code word set V4, which is established by the coding state S4, is only allowed to comprise code words beginning with a maximum of 1 bit having the logical "0" value. The reason for this is that code words beginning with a larger number of bits having the logical "0" value would result in transitional areas between the previously delivered code word and the code word to be delivered in which the number of successive bits having the logical "0" value may not always be smaller than or equal to 10, and therefore, would not satisfy the dk-constraint. For similar reasons, set V1 comprises only code words beginning with a number of bits having the logical "0" value that is greater than or equal to 2 and smaller than or equal to 9.

Sets V2 and V3 of code words belonging to the coding states S2 and S3 contain only code words beginning with a number of bits having a logical "0" value greater than or equal to 0 and smaller than or equal to 5. The code words satisfying this condition are spread over the two sets V2 and V3, so that sets V2 and V3 do not contain any common code words at all. Sets V2 and V3 will be referenced disjunct sets hereinafter. The spreading of the code words over sets V2 and V3 is preferably such that on the basis of the logical values of a limited number of p bits a determination can be made as to which set a code word belongs. In the example described above, the bit combination x1.x13 is used for this purpose. Code words from set V2 are recognizable from the bit combination x1.x13=0.0. Code words from set V3 are then recognizable from the combination x1.x13 which is unequal to 0.0.

A distinction is made between code words establishing coding state S1 (group G11) on delivery, code words establishing coding state S2 or S3 (group G2) on delivery, and code words establishing the coding state S4 (group G12) on delivery.

Set V1 comprises 138 code words from group G11, 96 code words from group G2 and 22 code words from group G12. It will be evident that the number of different code words in set V1 is smaller than the number of different 8-bit information words.

Since the code words from group G2 are always followed by a code word from set V2 or a code word from set V3, and, in addition, based on the code word following a code word from group G2, a determination may be made as to what set this code word belongs to, since a code word from group G2 followed by a code word from set V2 can be unequivocally distinguished from the same code word from group G2 but followed by a code word from set V3. Stated differently, when code words are assigned to an information word, each code word from group G2 can be used twice. Each code word from group G2 together with a random code word from set V2 forms a unique bit combination which is inseparable (i.e., distinguishable) from the bit combination formed by the same code word and a random code word from the same set V3. This means that 138 unique bit combinations (code words) from group G11 can be used for set V1, 22 unique bit combinations (code words) from group 612 and 2*96 unique bit combinations (code words from group G2 combined with subsequent code words) from group G2. This brings the total number of useful unique bit combinations to 352. The number of unique bit combinations formed with the code words from sets V2, V3 and V4 are 352, 351 and 415, respectively.

By way of illustration, FIG. 17 shows a code word 178 belonging to group G2. This means that the next code word belongs either to set V2 or set V3. Code word 178 and the next code word are thus capable of unambiguously establishing two different information words. In FIG. 17, code word 178 followed by a code word from set V2, for example, code word 179, establishes a different information word from the one established by code word 178 followed by a code word from set V3, for example, code word 180. Code word 179 belongs to group G11, meaning that code word 179 is always followed by a code word from set V1, regardless of the information word to be coded next, so that code word 179 is capable of establishing not more than a single information word. The same holds for code word 180.

The conversion of information words takes place as follows: Let us assume that the code word delivered last is code word 178 from group G2, the next code word will then belong either to set V2 or set V3, depending on the information word to be converted. Assuming that this information word establishes code word 179, this means that the next code word will belong to set V1. Which code word from set V1 is used is determined by the information word to be converted. In this example, this is code word 181. Code word 181 belongs to group G12, so that the next code word will belong to set V4. Which code word this will be will again be established by the information word to be converted. In this example this is code word 182. Code word 182 belongs to group G2. This means that, depending on the information word corresponding to code word 182, the next code word comes either from set V2 or from set V3. Which of the code words from set V2 or V3 is used depends on the information word to be converted. In this example, code word 182 is followed by code word 183. Code word 183 also belongs to group G2, so that, depending on the information word corresponding to code word 183, the next code word will come either from set V2 or V3. Which of the code words in the set is used again depends on the information word to be converted. In this case, this is code word 184. In the manner described above any random series of information words can be uniquely converted to a series of code words.

In the foregoing an explanation was given of the number of available code words extended by a subdivision of code words into groups of a first and a second type which establish a coding state, which coding states per se establish a set of code words from which a code word is to be selected for the conversion of a next information word. It is essential that the sets of code words from which a selection is to be made do not have code words in common in the event of coding states laid down by code words from a group of the second type. As a result, it is possible to assign the same code word from a set of code words to different information words, provided that due care is taken that the code words following this same code word belong to different sets that do not have code words in common. It will be obvious to a person skilled in the art that the subdivision of code words into sets and groups for obtaining code words to which more than one information word can be assigned can also be applied to code words having a different random number of bits. It is not necessary for the series of code words to satisfy a specific dk-constraint. Other constraints are possible, for example, as described in EP-A 0.319.103 to which U.S. Pat. No. 5,048,003 corresponds.

As explained hereinbefore, a larger number of available unique bit combinations arises from the fact that more than one unique bit combination can be established with code words from the group(s) of the second type (G2). Generally, the subdivision of code words into groups and sets will be selected such that the number of available unique bit combinations is larger than the number of different information words. This surplus of unique bit combinations provides the possibility of imposing additional constraints on the conversion.

One possibility is utilizing only as many available unique bit combinations as there are different information words. In that case, the surplus of unique bit combinations allows specific additional constraints on the code words to be imposed.

However, it is to be preferred for one or more of the sets to assign a pair formed by two code words from the associated set to each of a number of information words, and then select either of the available code words from the pair according to a certain criterion on conversion, so as to influence a specific property of the modulated signal.

A highly attractive possibility is influencing the low-frequency component in the modulated signal. This influence preferably consists of minimizing the DC components. This may be effected by determining the digital sum value at the end of each information word, signal portion and selecting such code words when the information is converted, so that the digital sum value determined at the end of each information portion continues to be in the neighbourhood of a certain reference value. This may be effected by assigning to a number of information words a pair of code words which effect different changes of the digital sum value. Preferably, each pair of code words comprises not more than two code words for which the changes of the digital sum values have opposite signs. For a given signal level at the end of the last information signal portion, the code word can then be selected for which the digital sum value will be nearest the reference value once the code word has been delivered.

Another possibility of selecting code words is selecting the code word for which, at the given signal level at the end of the code word delivered last, the sign of the digital sum value change caused by the associated code word will be opposite to that of the difference between the digital sum value prior to the delivery of the code word and the reference value. The selection of the code word to be delivered when a selection is possible from two code words having opposite influence on the digital sum value may then be simply made on the basis of the signal value at the end of each information signal portion and the sign of the difference between the digital sum value associated to this end and the reference value.

Figure 3A:
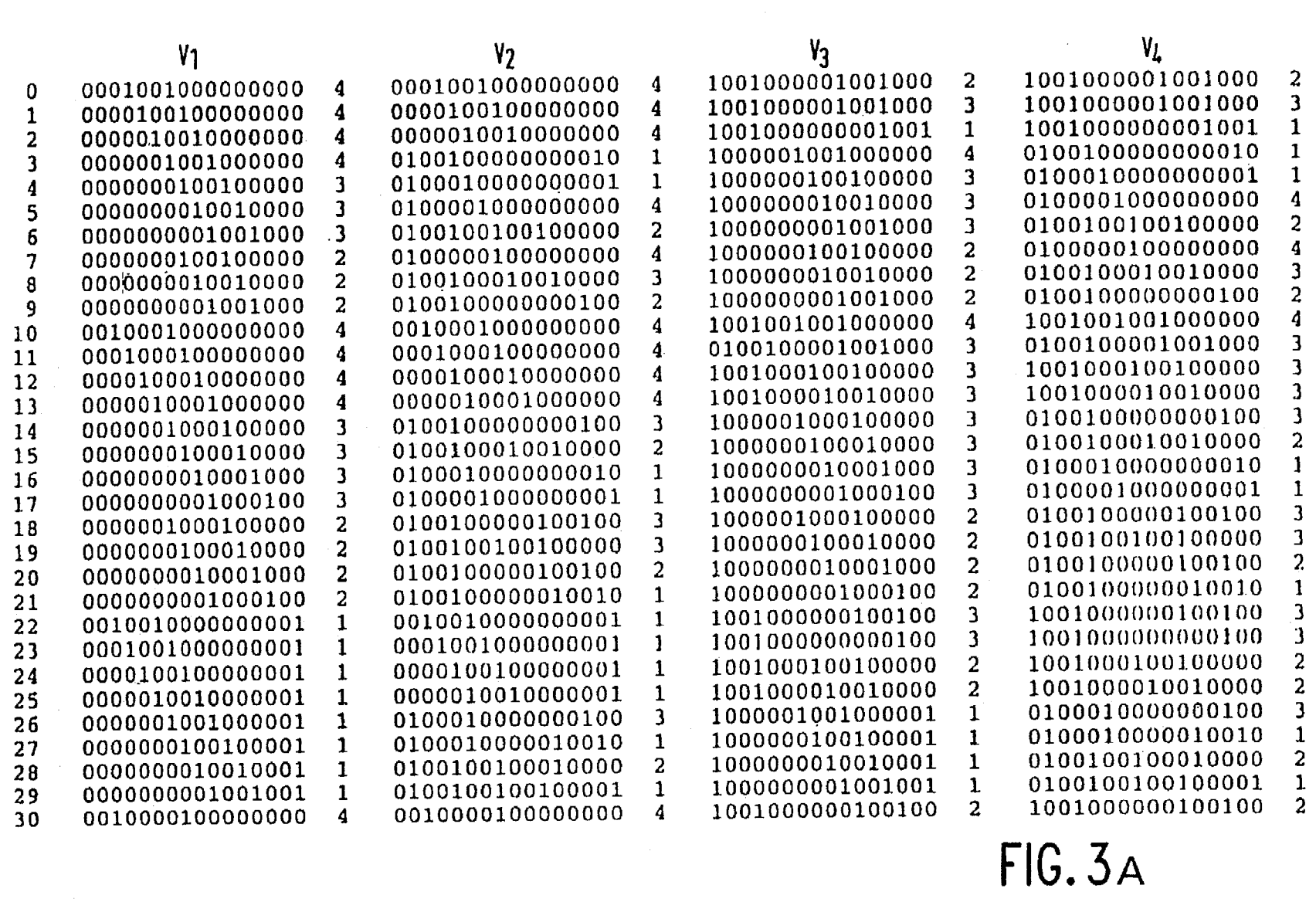
Figure 3B:
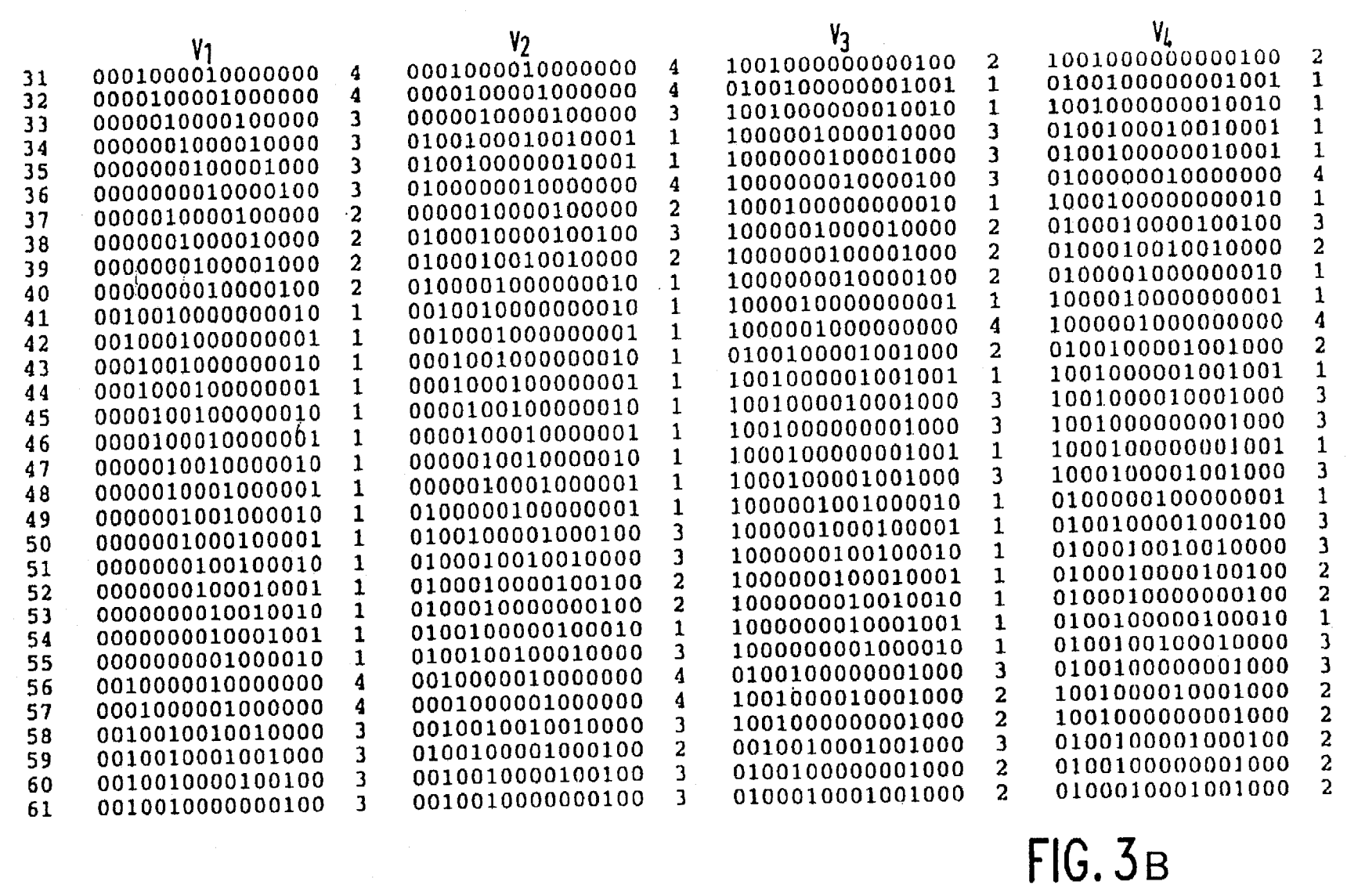
Figure 3C:
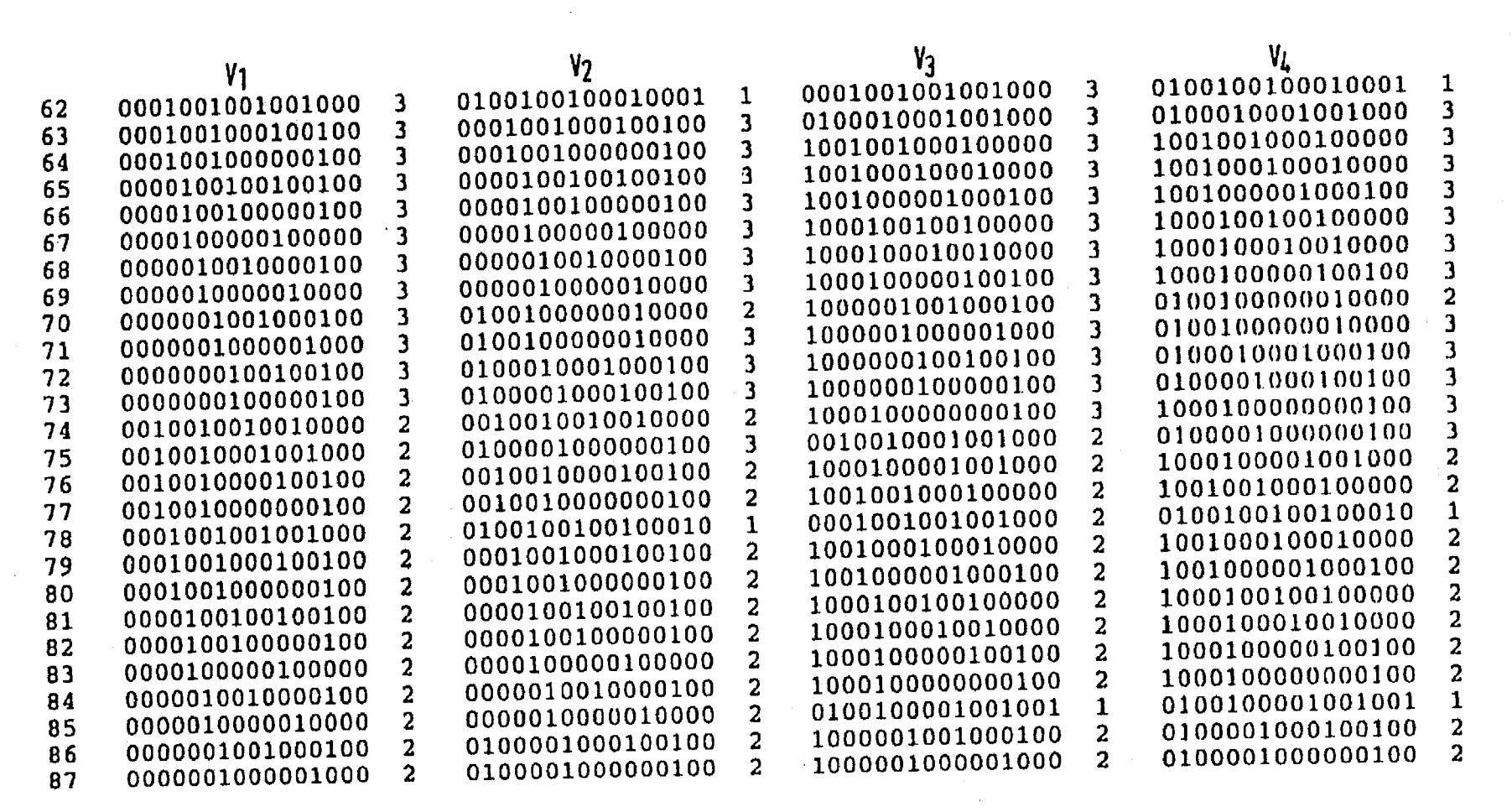

FIGS. 2A–J show by way of illustration for each of the sets V1, V2, V3 and V4 a code word assigned to each of the possible information words. In this figure, the first (left) column shows the word values of all possible information words. The second, fourth, sixth and eighth columns show the code words assigned to the information words from the respective sets V1, V2, V3 and V4. The third, fifth, seventh and ninth columns show by way of the respective digits 1, 2, 3 and 4 which of the coding states S1, S2, S3 and S4 are established by the associated code word. In FIGS. 2A–J not more than 256 of the available code words are used for each of the sets V1, V2, V3 and V4. FIGS. 3A–C show, similarly to FIGS. 2A–J, the code words of the sets not shown in the tables of FIGS. 2A–J for 88 information words to which a pair of two code words is assigned. The code words represented in FIGS. 3A–C will hereinafter be referenced alternative code words. The assigning of code words to the information words is such that the change of the digital sum value caused by the alternative code words FIGS. 3A–C is the opposite to the change of the digital sum value caused by the code words of FIGS. 2A–J which are assigned to the word values "0" to "87" inclusive.

It should be noted that all of the sets in FIGS. 3A–C contain equally as many code words. It will be obvious to a man of ordinary skill in the art that this is not a necessity. It is equally possible that these sets are not equally large.

Furthermore, it is observed that the assignment of code words to the information words is chosen to be such that the relation between, on the one hand, the combination of a code word and the bits x1 and x13 of the next code word and, on the other hand, the information words, is unique, so that the decoding can exclusively be effected based unpon a received code word and the bits x1 and x13 of the next code word. For the code word assignment, this means that if a code word occurs in different sets, the same code words in different sets represent the same information words. For example, the information word having the word value "2" is represented by the code word "0010000000100100" in the sets V1 and V2 and by the code word "1000000000010010" in the sets V3 and V4 shown in FIG. 2A.

It is not necessary that code words from different sets represent the same information words. However, this does mean that the coding state is to be recovered on decoding to reconstitute the original information word.

The conversion of a series of information words into a series of code words will be further explained with reference to FIG. 4.

Column IW of FIG. 4 shows from top to bottom the word values of a series of successive m-bit information words. For each of the information words for which a word value is included in column IW, FIG. 4 shows data relating thereto. The column SW represents the coding state laid down when the preceding code word was delivered, which code word was obtained as a result of the conversion of the preceding information word. This code word will hereinafter be referenced the preceding code word. The coding state in column SW denotes which of the sets V1, V2, V3 and V4 of code words is to be used for the conversion of the information word. Column LB shows the signal value of the modulated signal at the end of the information signal which portion corresponds with the code word obtained when the preceding information word was converted. This signal value will hereinafter be referenced the running information signal value. In the column D S V, the digital sum value is shown which belongs to the running signal value of the modulated signal, i.e., the running modulated signal value.

Column CW of FIG. 4 shows the code words assigned to the information words of column IW according to the tables of FIGS. 2A–J and 3A–C. In the case where a pair of code words is assigned to an information word, the two code words of the pair are shown, the upper code word of the pair corresponding to the tables of FIGS. 2A–C and the lower code word of the pair corresponding to the tables of FIGS. 3A–C. Column dDSV shows the change in the digital sum value caused by the code word, assuming that the running modulated signal value would have had value "H".

Column DSVN of FIG. 4 shows the new digital sum value for the associated code word as this value would be for the case where the associated code word is delivered. Column LBN represents via a logical "1" that the signal value at the beginning and end of the information signal portion belonging to the code word are different. A logical "0" indicates that the signal values at the beginning and end of the associated information signal portion are equal. The signal value at the beginning and end of an information signal portion are different if the associated code word contains an odd number of "1" bits, which corresponds to an odd number of changes of signal levels in the information signal portion. With an even number of "1" bits in the code word, the signal value at the beginning and end of the information signal portion is the same. In the column SWN, the coding state is shown which would be established in the case where the relevant code word is delivered.

Finally, column CS shows by an asterisk "*" which code word is actually delivered for the associated information word.

The first (top) word from the series of code words shown in column IW of FIG. 4 has a word value of "2". Let us assume that the coding state (column SW) is S1 when the conversion of the series of information words is initiated, the modulated signal begins with the signal level H and the digital sum value D S V is equal to 0. In that case, the associated DSVN value is equal to –6 for the upper code word of the pair whereas the DSVN value is +10 for the lower code word of the pair. When the criterion is applied that a code word for which the DSVN value is as close as possible a reference value of 0, be delivered the upper of the two code words of the pair is delivered for the information word having the word value of "2". This means that the coding state for the next information word (word value "8") becomes S2. At the end of the information signal portion corresponding to the delivered code word, the signal value is L, meaning that the signal value at the beginning of the next information portion is thus L as is shown in column LB. The value of dDSV for the upper code word of the pair belonging to the information word having the word value of "8" is equal to –6. This value of –6 applies to the case where the signal value at the beginning of the associated information signal portion would be H. Since this signal value is L in the situation shown, the change of the digital sum value caused by the code word is not equal to –6, but +6. This means that DSVN becomes equal to 0. For the lower code word of the pair, DSVN is equal to –18. The value of DSVN for the upper code word is closest to the value of 0, so it is delivered. Subsequently, the information word having the word value of "100" is to be converted. Only one code word is assigned to this information word, so selection depending on DSVN is impossible for this information word. Similarly to the manner described above, the information words having the word values "230", "0", "61" and "255" are converted. Each time a conversion is to take place of an information word to which a pair of code words is assigned, that particular code word is selected from the pair for which the value of DSVN is nearest zero. In this manner, the DC voltage level of the modulated signal is maintained at a substantially constant level and the frequency spectrum of the modulated signal will not show any low-frequency components. Although a set of code words is not available for each information word, an influencing of the digital sum value will nevertheless be possible for 88/256 of all the information words to be converted on average. In practice this appears to be amply sufficient to provide that the low-frequency component is absent in the modulated signal.

It is preferred to include in the code word pairs those code words for which the change caused in the digital sum value is greatest. On the one hand, this is advantageous in that the digital sum value can be changed to its maximum. On the other hand, this means that the change caused in the digital sum value is relatively small for code words not belonging to a pair and that the influence of these code words on the digital sum value is relatively small.

Figure 5A:
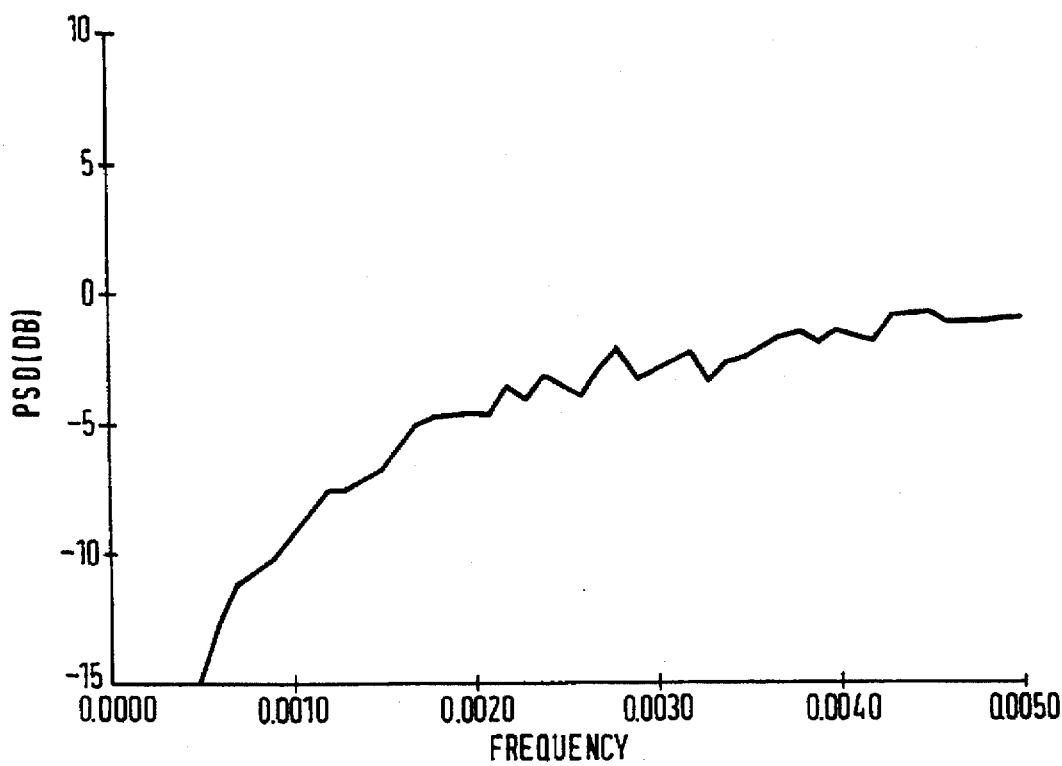
FIGS. 5a and 5b show the low-frequency portions of frequency spectra of various signals.
Figure 5B:
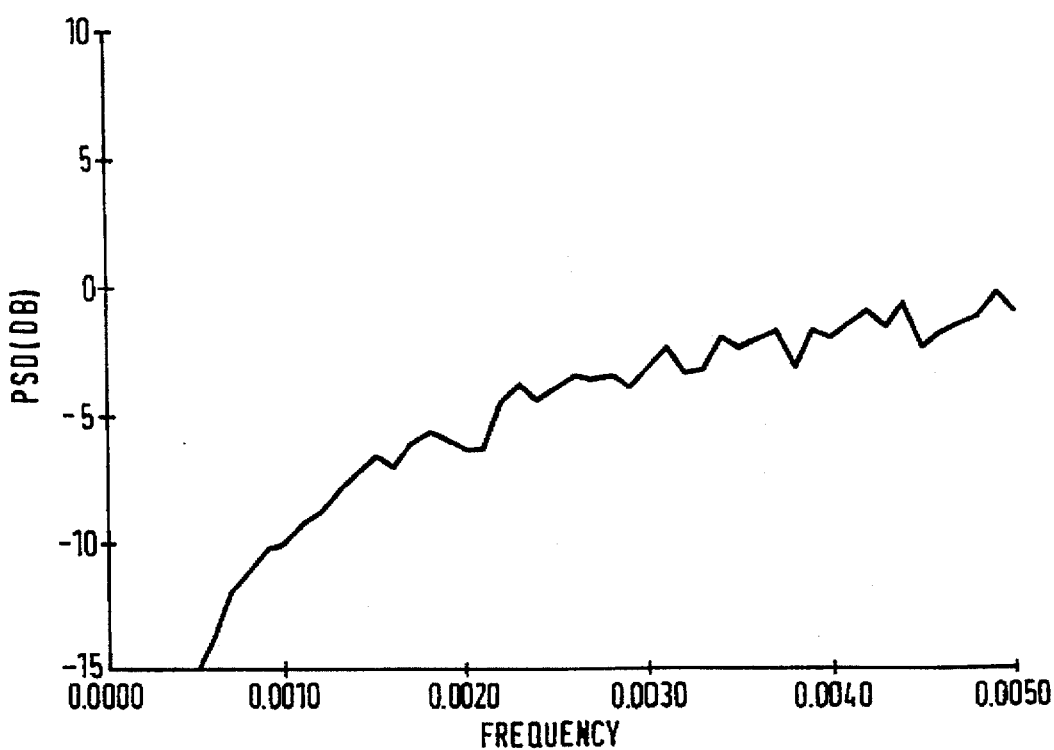

By way of illustration, FIG. 5a shows the low-frequency portion of the frequency spectrum of a modulated signal obtained by implementing the method according to the invention. In FIG. 5b, the corresponding low-frequency portion of the frequency spectrum of an EFM-modulated signal is plotted. As appears from the FIGS. 5a and 5b, the frequency spectra for the two signals are substantially the same. The dk-constraint for the EFM-modulated signal and the modulated signal obtained by implementing the method according to the invention is also substantially the same. The number of bit cells per information word in an EFM-modulated signal is equal to 17, whereas this is equal to 16 in a modulated signal according to the invention. This means that if the method according to the invention is implemented, an increase of information density of about 7% is obtained relative to an EFM-modulated signal, without the cost of an increase of the low-frequency contents and without any concessions to the dk-constraint.

Figure 6:
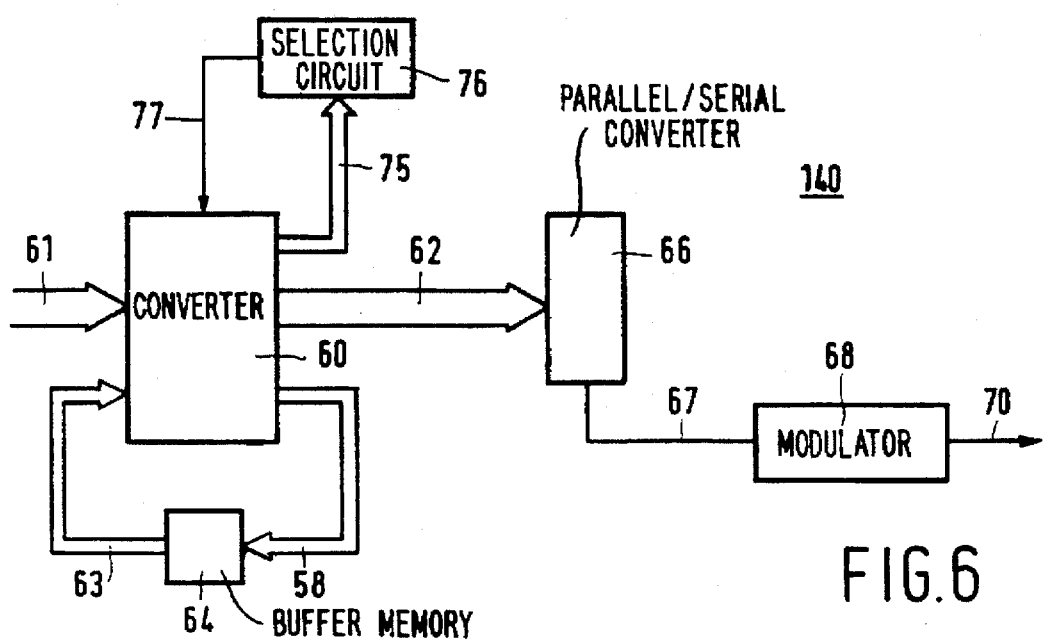

FIG. 6 shows an embodiment for a coding device 140 according to the invention by which the method described above can be carried out. The coding device 140 is arranged for convening the m-bit information words 1 to the n-bit code words 4. The number of different coding states can be indicated by s bits. The coding device 140 comprises a converter 60 for convening (m+s+1) binary input signals to (n+s+t) binary output signals. From the inputs of the converter 60, m inputs are connected to a bus 61 for receiving m-bit information words. From the outputs of the converter 60, n outputs are connected to a bus 62 for delivering n-bit code words. Furthermore, s inputs are connected to an s-bit bus 63 for receiving a state word denoting the current coding state. A state word is delivered by a buffer memory 64, for example, in the form of s flip-flops. The buffer memory 64 has s inputs connected to a bus 58 for receiving a state word to be stored in the buffer memory 64. For delivering the state words to be stored in the buffer memory 64, s outputs of the converter 60 are used and connected to bus 58.

Bus 62 is connected to the parallel inputs of a parallel/serial converter 66, which converts code words 4 received over bus 62 to a serial bit string to be supplied over a signal line 67 to a modulator circuit 68. Modulator circuit 68 converts the bit string to the modulated signal 7 to be delivered over signal line 70. The modulator circuit 68 may be one of a customary type, for example, a so-called modulo-2 integrator.

In addition to the code words and state words, the converter 60 applies to a bus 75 for each received combination of information word and state word information which (a) denotes whether for the associated state word a the code word or a pair of code words is assigned to the associated information word, (b) denotes for each of these assigned code words the change dDSV of the digital sum value caused by the code word for the situation where this change would be for a high signal value at the beginning of an information signal portion corresponding to this code word, (c) denotes whether the number of "1" bits in the code word is odd or even.

For information transfer to a selection circuit 76, the bus 75 is connected to inputs of the selection circuit 76.

Based on this information, the selection circuit 76 delivers a selection signal which indicates whether the code word to be fed to the bus 62 for the presented information word is to be converted in accordance with the relations laid down in the tables of FIGS. 2A–J, or in accordance with the relations laid down in the tables of FIGS. 3A–C. This selection signal is applied to the converter 60 over a signal line 77.

The converter 60 may comprise a ROM memory in which the code word tables shown in FIGS. 2A–J and 3A–C are stored at addresses determined by the combination of state word and information word applied to the inputs of the converter 60. In response to the detection signal, the addresses of the memory locations are selected for the code words corresponding to the tables shown in FIGS. 2A–J or the addresses of the memory locations for the code words corresponding to the tables shown in FIGS. 3A–C.

In the embodiment shown in FIG. 6, the state words are stored in memory 60. Alternatively, it is possible to derive, by a gate circuit, only the state words from the code words delivered to the bus 62.

Instead of comprising a ROM memory, the converter 60 may also comprise a combinatorial logical circuit formed by gate circuits. The synchronization of the operations executed in the arrangement may be obtained in customary fashion with synchronized clock signals which can be derived by a customary (not shown) clock generating circuit.

Figure 7:
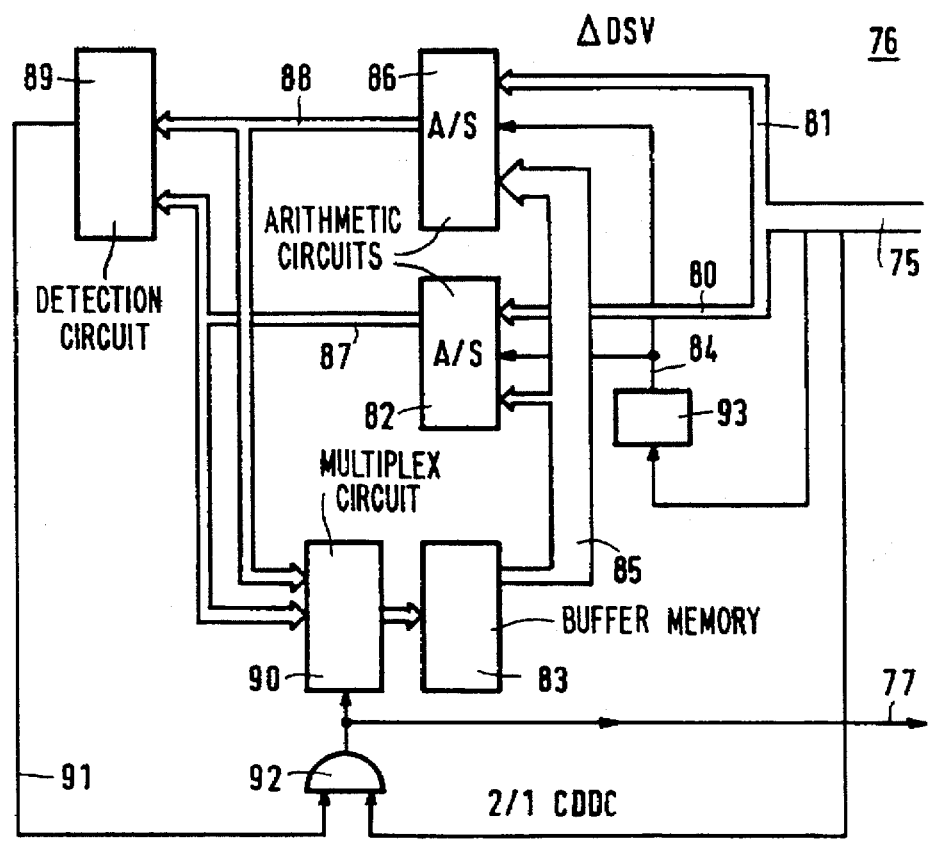
FIG. 7 shows an embodiment for a selection circuit to be used in the coding device shown in FIG. 6.

FIG. 7 shows a possible embodiment for the selection circuit 76. Signal lines forming the bus 75 are split up into a sub-bus 80 and a sub-bus 81. The value of dDSV is transferred over sub-bus 80 for a code word from the tables shown in FIGS. 2A–J that is assigned in response to the received combination of state word and information word. Over sub-bus 81 is transferred the value of dDSV for the code words from the tables shown in FIGS. 3A–C in the case where these tables contains a code word for the associated combination of state word and information word. Sub-bus 80 is connected to a first input of an arithmetic circuit 82. A second input of the arithmetic circuit 82 receives, over a bus 85, the value of D S V stored in a buffer memory 83. Furthermore, a control input of the arithmetic circuit 82 receives a control signal over a signal line 84, which signal indicates whether the signal value at the beginning of the information signal portion corresponding to the associated code word has the high value H or the low value L. The signal on signal line 84 is obtained by means of, for example, a flip-flop whose state is constantly adapted when a code word is delivered, which adaptation takes place in response to a signal denoting whether the number of bits having a logical "1" value in the delivered code word is odd or even. This signal is delivered by the converter 60 and supplied over one of the signal lines forming the bus 75. The arithmetic circuit 82 is one of a customary type for subtracting or adding the value dDSV received over bus 80 from or to respectively, the value of D S V received over bus 85 in response to the control signal.

The selection circuit 76 comprises a further arithmetic circuit 86 which, similarly to the arithmetic circuit 82, adds the value of dDSV received over bus 81 to the value of D S V received over bus 85 or subtracts it therefrom in response to the control signal on signal line 84.

The results of the operations performed by the arithmetic circuits 82 and 86 are applied over buses 87, and 88, respectively, to a decision circuit 89 and a multiplex circuit 90. These results represent, if a code word pair has been assigned to the presented state word, the new digital sum value changes DSVN that would be obtained on delivery of the two different code words of the pair. The decision circuit 89 is of a customary type which determines, in response to the values of DSVN received over the buses 87 and 88, which of the two received values is closest to a reference value. Because circuit 89 feeds a decision signal corresponding to this result to a signal line 91. In the event of a choice from two code words from a pair of code words, the decision signal indicates which of the two code words is to be delivered. This decision signal is applied to the signal line 77 through an AND-gate 92. In the case where only one code word is available, not in a pair of code words, the signal on signal line 77 indicates that the information word delivered in accordance with the tables shown in FIGS. 2A–J is to be converted. To realize this, a second input of the AND-gate 92 is supplied with a signal coming from bus 75 which indicates whether a single code word or a code word pair is available for the presented combination of state word and information word.

The signal line 77 is also connected to a control input of the multiplex circuit 90. Depending on the signal on its control input, the multiplex circuit 90 passes the values of DSVN received over buses 87 and 88 on to an output belonging to the delivered code word. The output of the multiplex circuit 90 is coupled to the input of the buffer memory 83. The loading of the buffer memory 83 is controlled in a customary fashion, so that the value of DSVN passed on by the multiplex circuit 90 is stored in the buffer memory 83 when the selected code word is delivered.

In the case where a set of code words is available for a presented information word in the embodiment for the coding device 140 show in FIG. 6, the code word is selected from the pair for which the digital sum value is closest to a predetermined reference value when the associated code word is delivered. Another possibility of selecting code words from the code word pair is selecting that code word for which the sign of the digital sum value change, which change is caused by the delivery of the code word, is opposite to the sign of the digital sum value at the beginning of the delivery of the code word.

FIG. 8 shows an embodiment for a coding device according to the invention in which the code words are selected on the basis of last mentioned criterion. The coding device is again arranged for converting the m-bit information words 1 to the n-bit code words 4, where the number of different coding states can be represented by s bits. The coding device comprises a converter 50 for converting (m+s+1) binary input signals to (n+s) binary output signals. From the inputs of the converter 50, m inputs are connected to a bus 51 for receiving m-bit information words. From the outputs of the converter 50, n outputs are connected to a bus 52 for delivering n-bit code words. Furthermore, s inputs are connected to an s-bit bus 53 for receiving a state word that indicates the instantaneous coding state. The state word is delivered by a buffer memory 54 comprising, for example, s flip-flops. The buffer memory 54 has s inputs connected to a bus 55 for receiving a state word to be loaded in the buffer memory 54. For delivering the state words to be loaded in the buffer memory 54, s outputs of the converter 50 are used.

Bus 52 is connected to the parallel inputs of a parallel/serial converter 56, which converts the code words supplied over bus 52 to a serial bit string to be applied, over a signal line 57, to a modulator circuit 58. Modulator circuit 58 converts the bit string to the modulated signal 7 to be delivered over a signal line 40. The modulator circuit 58 may be one of a customary type, for example, a modulo-2 integrator. The modulated signal 7 is applied to a circuit 59 of a customary type for deriving the running digital sum value of the modulated signal 7. Circuit 59 delivers a signal Sdsv, which depends on the determined digital sum value. The signal Sdsv denotes whether a presented information word is to be converted according to the relations laid down in FIGS. 2A–J or a presented information word is to be converted according to the relations laid down in FIGS. 3A–C.

The converter 50 may be of a similar type to converter 60, except for the fact that in the converter 50 only the code words and the associated state words need to be stored. The information supplied to the decision circuit 76 by the converter 60 over bus 75 is redundant, and therefore unnecessary, in the embodiment shown in FIG. 8.

For the purpose of synchronization of the operations to be performed, the coding device shown in FIG. 8 comprises a clock generating circuit 41 of a customary type for generating clock signals for controlling the parallel/serial converter 58 and for controlling the loading of the buffer memory 54.

Preferably, the modulated signal 7 comprises sync signal portions which have a signal pattern that cannot occur in a random sequence of information signal portions. The addition may be effected by inserting sync words into the sequence of n-bit code words. FIG. 9 shows two 26-bit sync words 100 and 101 which are pre-eminently suitable for use in combination with the code words shown in FIGS. 2A–J and 3A–C. The sync words each contain two series of 10 bits having a logical "0" value separated by a bit having a logical "1" value. Only the logical value of the bit at the first location in the code word (x1) is different for the two sync words 100 and 101. Which of the two code words is inserted depends on the coding state determined by the code word situated immediately before the inserted sync word.

In the case where the coding state S1 is determined, sync word 101 beginning with 3 bits having the logical "0" value is inserted. Since the code words determining the coding state S1 end in 1 bit having a logical "0" value at the most, the dk-constraint with d=2 and k=10 is satisfied when a transition is made from the code word to the sync word.

In the case where the coding state S4 is laid down, sync word 100 is inserted. Since the code words establishing the coding state S4 end in a minimum of 6 and a maximum of 9 bits having the logical "0" value, the dk-constraint with d=2 and k=10 is satisfied at the transition from the code word to the sync word.

In the case where the coding state S2 is established, the sync word 101 is inserted. In this sync word, the bit combination x1.x13 is equal to 0.0. In the case where the coding state S3 is established, the sync word 100 is inserted. In this sync word, the bit combination x1.x13 is equal to 1.0. In the sync word following a code word that establishes the coding state S2, this bit combination x1.x13 is always 0.0 and for a sync word following a code word which establishes state S3 the bit combination x1.x13 is always 1.0, so that an associated information word is always unambiguously established on the basis of the code word and the next code word.

The sync words 100 and 101 both end in a bit having the logical "1" value, which means that the code word following either of these sync words is to be selected from the set V1 to provide that at the transition from the sync word to the next code word the dk-constraint, with d=2 and k=10, is always satisfied. This means that the coding state S1 is established with each delivery of a code word.

FIG. 10 shows a modification of the coding device shown in FIG. 6 by which sync words can be inserted in the manner described above. In FIG. 10, like components to those of FIG. 6 are designated with like reference characters. The modification relates to a memory 103 having two memory locations which store each of the two sync words 100 and 101. The memory 103 comprises an addressing circuit for addressing either of the two memory locations in dependence on the state word applied to address inputs of the memory 103 over the bus 63. The sync word in the addressed memory location is applied to a parallel/serial converter 105 over a bus 104. The serial output of the converter 105 is applied to a first input of an electronically operable switching unit 106. The signal line 67 is connected to a second input of the switch unit 106. The coding device is controlled by a control circuit 107 of a customary type which alternately brings the coding device to a first or to a second state. In the first state, a predetermined number of information words are converted to code words which are applied in the serial mode to the modulo-2 integrator 68 via the switch unit 106. At the transition from the first to the second state, the conversion of information words is interrupted and the sync word determined by the state word is delivered by memory 103 and applied to the modulo-2 integrator 68 via the parallel/serial converter 104 and the switch unit 106. In addition, at the transition from the second to the first state and under the control of the control circuit 107, the buffer memory 64a is loaded with the state word that corresponds to the coding state S1 and, subsequently, the conversion from information words to code words is resumed until the coding device is again brought to the second state by the control circuit 107.

For the insertion of sync words, the coding device shown in FIG. 8 can be adapted in a way similar to the adaptation shown in FIG. 10.

Figure 11:
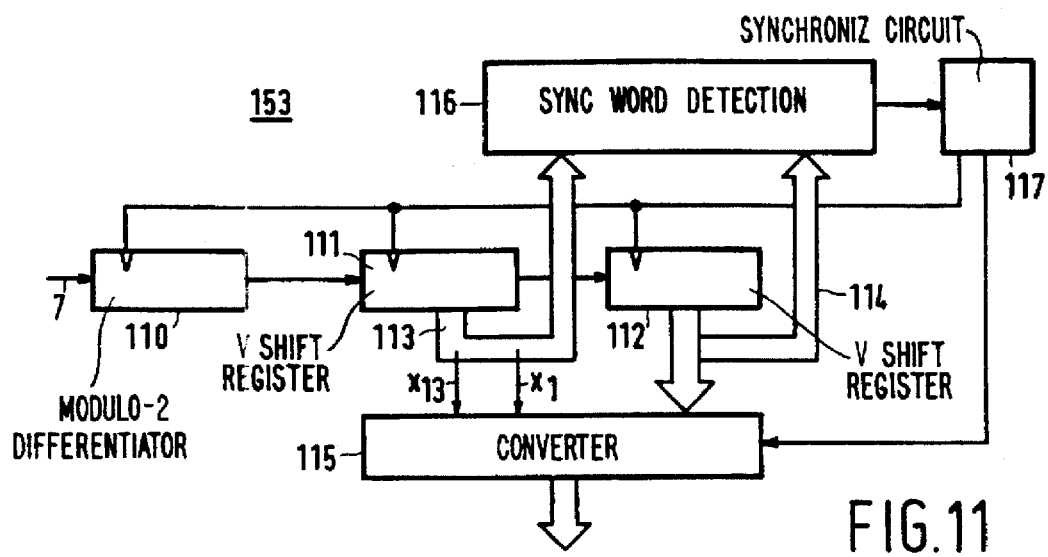
FIG. 11 shows a decoding device in accordance with the invention.

FIG. 11 shows an embodiment for a decoding device 153 according to the invention for reconverting modulated signals obtained with one of the methods described above to a sequence of information words. The decoding circuit 153 comprises a modulo-2 differentiator 110 for converting the modulated signal to a bit string in which a bit having a logical "1" value represents a transition from a bit cell having a signal value L to a bit cell having a signal value H or vice versa and in which each bit cell having the logical "0" value represents two successive bit cells having the same signal value. The bit string thus obtained is applied to two series-connected shift registers 111 and 112, each having a length corresponding to the length of an n-bit code word. The contents of the shift registers 111 and 112 are supplied to the respective buses 113 and 114 through parallel outputs. The decoding device 153 comprises an (n+p)-to-m-bit converter 115. All of the n bits present in shift register 112 are applied to inputs of converter 115 over bus 114. From the n bits present in the shift register 111, p bits are applied to the converter 115, which p bits, together with the n bits in the shift register 114, uniquely establish an information word. The converter 115 may comprise a memory with a look-up table which contains an m-bit information word for each permitted bit combination formed by the n bits of an n-bit code word and the predetermined p bits of a bit string part following this code word. The converter, however, may also be realized by gate circuits.

The conversions performed by the converter 115 may be synchronized in customary fashion by means of a synchronizing circuit 117, so that each time a complete code word is loaded in the shift register 112, the information word is presented on the outputs of the converter which information word corresponds to the bit combination applied to the inputs of the converter 115.

Preferably, a sync word detector 116, connected to buses 113 and 114 and, which detects a bit pattern corresponding to the sync words is used for the synchronization.

Figure 16:
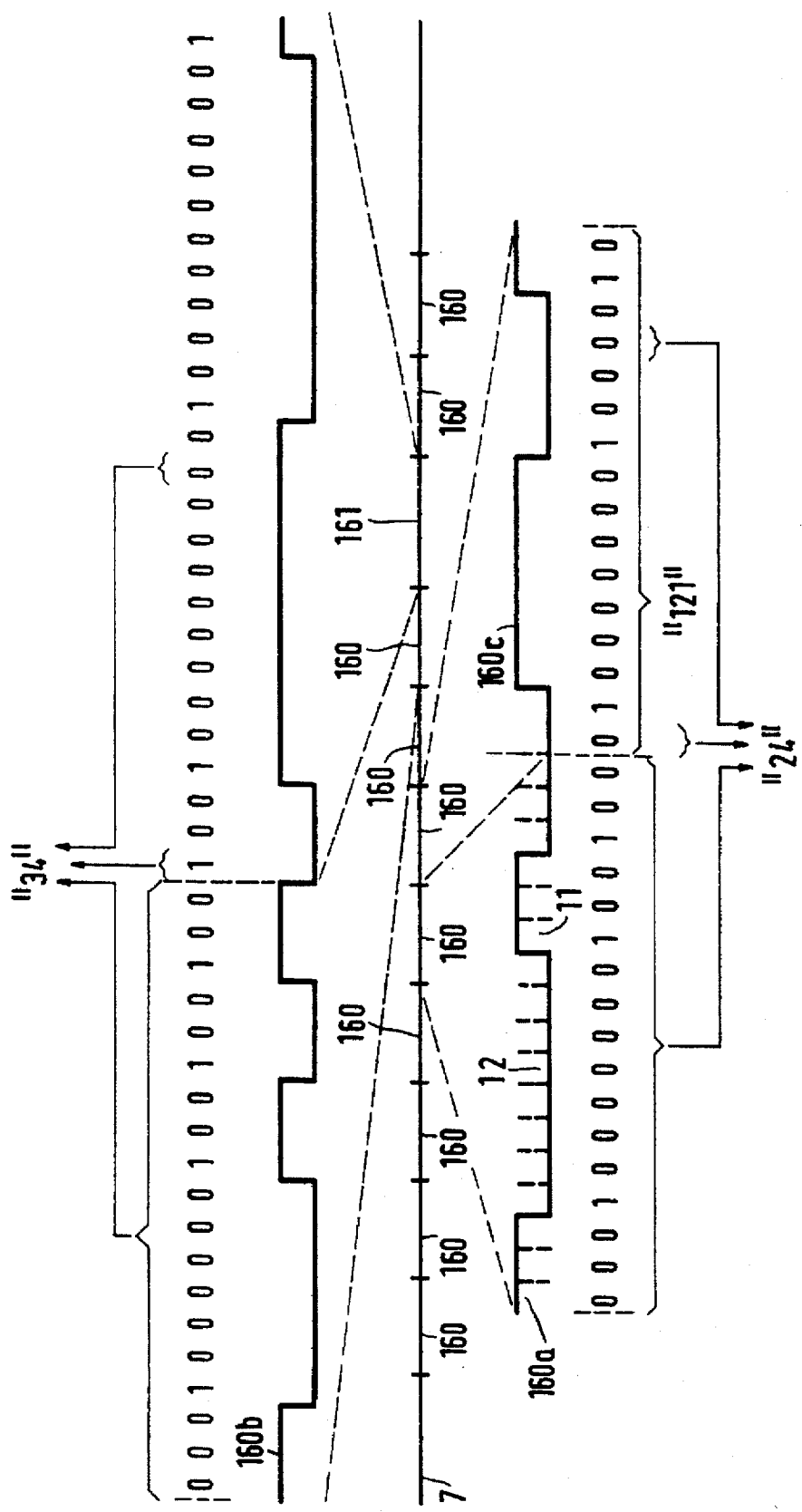
FIG. 16 shows parts of a modulated signal and its corresponding code words.

By way of illustration, FIG. 16 shows a signal that may be obtained in accordance with the invented method described above. The signal comprises a sequence of q successive information signal portions 160, where q is an integer, which signal portions represent q information words. Between the information signal portions are inserted sync signal portions, one of which being designated 161 in FIG. 16. A number of information signal portions are shown in detail. Each of the information signal portions 160 comprises n bit cells, in this case 16, which have a first (low) signal value L or a second (high) signal value H. Since the bit string formed by the code words and represented by the modulated signal satisfies a dk-constraint, the number of successive bit cells having the same signal value will at least be equal to d+1 and at most be equal to k+1. Due to the selection of the code words which depends on the digital sum value, the running value of the difference between the number of bit cells having the first signal value and the bit cells having the second signal value at an arbitrary point in the signal is essentially constant in the signal portion preceding this point. Each information signal portion corresponding to a code word from a group of the first type uniquely establishes an information word. In FIG. 16 this is, for example, information signal portion 160c which corresponds to code word "0100000001000010". This code word uniquely establishes the information word having the word value "121". Each information signal portion representing a code word from the group of the second type uniquely represents, together with an adjacent signal portion, an information word.

The information signal portion 160a shown in FIG. 16 corresponds to the code word "0001000000100100". This code word may establish both the information word having the word value "24" and the information word having the word value "34". What information is actually established by this code word is determined by the logical values on the first and thirteenth bit location of the immediately following portion of the bit string. If the logical values of these bits are both equal to 0, the information word having the word value "24" is established. If these bits are unequal to "0", the information word having the word value "34" is established. In FIG. 16, the values of the bits on the first and thirteenth locations after the code word established by the information signal portion 160a are both equal to "0", so that the information word having the word value "24" is established. The code word established by the information signal portion 160b is identical with the code word established by the information signal portion 160a. The code word represented by the information signal portion 160b, however, is immediately followed by a sync word of which the first bit has the logical "1" value, so that now the information word having the word value "34" is established.

Figure 12:
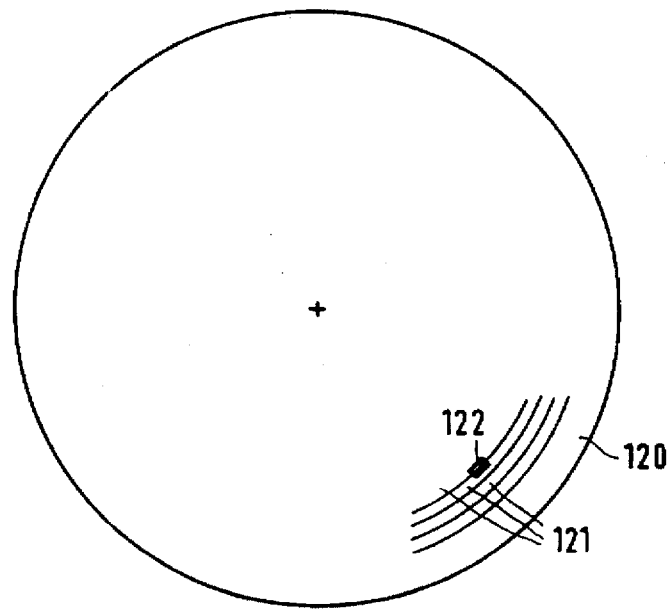
FIG. 12 shows a record carrier in accordance with the invention.

FIG. 12 shows by way of example, a record carrier 120 according to the invention. The record carrier shown is one of an optically detectable type. The record carrier may also be of a different type, for example, of a magnetically readable type.

Figure 13:
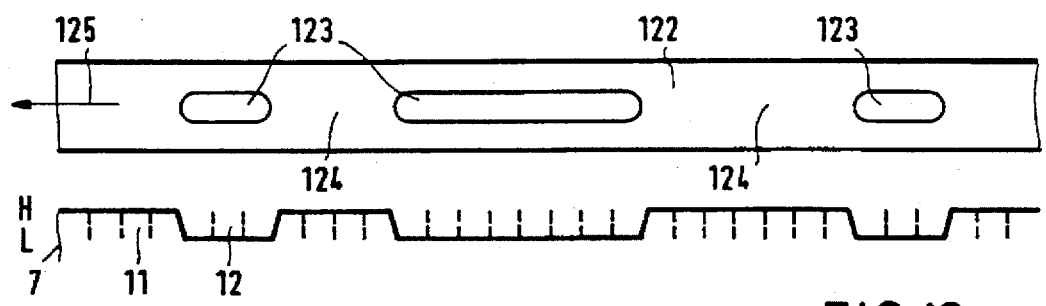
FIG. 13 shows a considerably enlarged potion of the record carrier of FIG. 12.

The record carrier 120 comprises information patterns arranged in tracks 121. FIG. 13 shows a strongly enlarged portion 122 of one of the tracks 121. The information pattern in the track portion 121 shown in FIG. 13 comprises first sections 123, for example, in the form of optically detectable marks and second sections 124, for example, intermediate areas lying between the marks. The first and second sections alternate in a direction of the track 125. The first sections 123 present first detectable properties, and the second sections 124 present second properties which are distinguishable from the first detectable properties. The first sections 123 represent bit cells 12 of the modulated binary signal 7 having one signal level, for example, the low signal level L. The second sections 124 represent bit cells 11 having the other signal level, for example, the high signal level H. The record carrier may be obtained by first generating the modulated signal and then providing the record carrier with the information pattern. If the record carrier is of an optically detectable type, the record carrier can then be obtained with mastering and replica techniques known per se based on the modulated signal 7.

Figure 14:
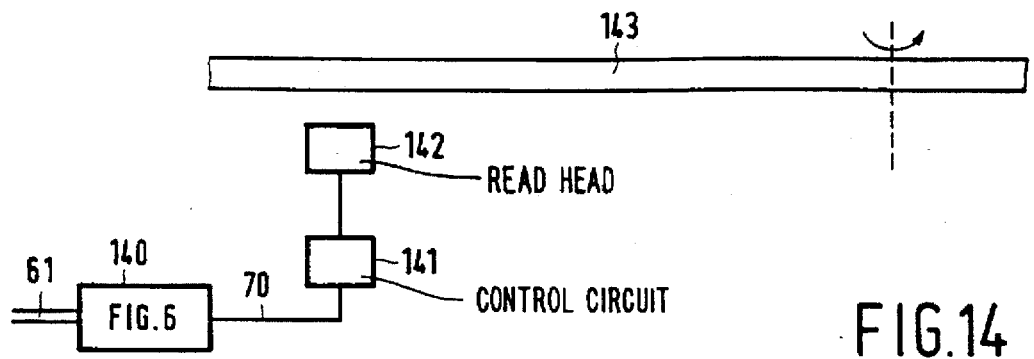
FIG. 14 shows a recording device in accordance with the invention.

FIG. 14 shows a recording device for recording information, in which a coding device according to the invention is used, for example, the coding device 140 shown in FIG. 6. In the recording device, the signal line 70 delivers the modulated signal 7 to a control circuit 141 for a write head 142. The write head 142 is of a customary type capable of introducing marks having detectable changes on a record carrier 143 of a writable type as it is moved. The control circuit 141 may also be of a customary type generating a control signal for the write head 142 in response to the modulated signal 7 applied to the control circuit 141, so that the write head 142 introduces a pattern of marks that corresponds to the modulated signal 7 on the record carrier 143.

Figure 15:
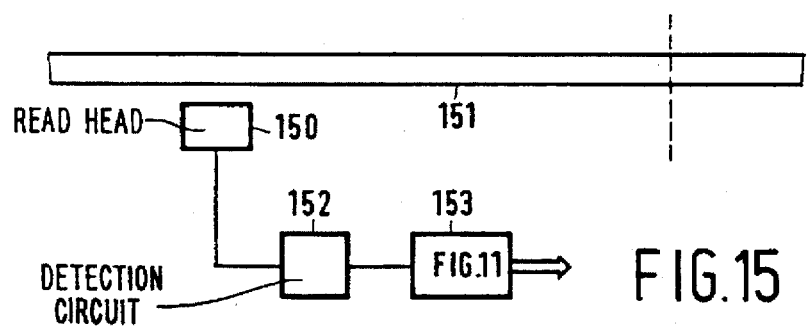
FIG. 15 shows a reading device in accordance with the invention.

FIG. 15 shows a reading device in which a decoding device according to the invention is used, for example, the decoding device 153 shown in FIG. 11. The reading device comprises a read head 150 of a customary type for reading a record carrier 151 according to the invention, which record carrier 151 carries an information pattern that corresponds to the modulated signal 7. The read head 150 then produces an analog read signal modulated according to the information pattern read out by the read head 150. Detection circuit 152 converts this read signal in customary fashion to a binary signal which is applied to the decoding circuit 153.

I claim:

1. A method of converting a series of m-bit information words to a modulated signal, with m being an integer, in which method an n-bit code word is delivered for each received information word, with n being an integer exceeding m, and the delivered code words are converted to the modulated signal, and in which the series of information words is converted to a series of code words according to rules of conversion so that the corresponding modulated signal satisfies a predetermined criterion, wherein the code words are divided into at least one group of code words of a first type and at least one group of code words of a second type, where the delivery of each of the code words belonging to a group of the first type establishes a first type of coding state determined only by the group to which that code word belongs, and the delivery of each of the code words belonging to a group of the second type establishes a second type of coding state determined not only by the group to which that code word belongs but also by information content in the information word itself for which that code word is delivered, each coding state corresponding to a different set of code words into which information words are converted and when one of the code words is assigned to a received information word, that code word is selected from the set of code words that corresponds to the coding state of the first type or the second type established when a preceding code word was delivered, where the sets of code words corresponding to coding states of the second type do not contain any code words in common.

2. A method of converting a series of m-bit information words to a modulated signal, with m being an integer, in which method an n-bit code word is delivered for each received information word, with n being an integer exceeding m, and the delivered code words are converted to the modulated signal, and in which the series of information words is converted to a series of code words according to rules of conversion so that the corresponding modulated signal satisfies a predetermined criterion, wherein the code words are divided among at least one group of a first type and at least one group of a second type, where the delivery of each of the code words belonging to a group of the first type establishes a first type of coding state determined by the group to which that code word belongs, and the delivery of each of the code words belonging to a group of the second type establishes a second type of coding state determined by the group to which that code word belongs and the information word for which that code word is delivered, and when one of the code words is assigned to a received information word, that code word is selected from a set of code words that depends on the coding state of the first type or the second type established when a preceding code word was delivered, where sets of code words belonging to coding states of the second type do not contain any code words in common, wherein the series of information words is converted to the series of code words according to the rules of conversion so that the corresponding modulated signal presents substantially no frequency components in a low-frequency area in the frequency spectrum and each number of successive bit cells having a same signal value in the modulated signal is at least d+1 and at most k+1, and the sets of code words for each of at least a number of information words comprises at least a pair of code words, with low-frequency components in the modulated signal being avoided when the information words are converted by selected code words from the pairs of code words.

3. The method as claimed in claim 2, wherein a running digital sum value is established as a measure for current DC contents, which value is determined over a preceding portion of the modulated signal and denotes for this portion the current value of a difference between the number of bit cells having a first signal value and the number of bit cells having a second signal value, the pairs of code words comprising two code words have opposite effects on the digital sum value, and the code words are selected from the pairs in response to certain digital sum values so that the digital sum value continues to be limited.

4. The method as claimed in claim 2, wherein the modulated signal has bit cells of a first signal value and bit cells of a second signal value, and the series of information words are converted to a series of code words which establish a bit string having bits of a first logical value and bits of a second logical value, in which a number of successive bits having the first logical value and situated among bits having the second logical value is at least d and at most k, and the bit string is converted to the modulated signal, in which transitions from bit cells having the first signal value to bit cells having the second signal value or vice versa correspond to the bits having the second logical value in the bit string.

5. The method as claimed in claim 2, wherein the code words are made up of bits having first and second logic values, and the sets of code words belonging to the coding states of the second type can be mutually distinguished on the basis of the logical values of bits at p predetermined bit positions in the code words, where p is an integer smaller than n.

6. The method as claimed in claim 5, wherein sync words are inserted into the series of code words, the sync words showing bit patterns that cannot occur in a bit string formed by the code words and having different bit patterns, the sync word being used depends on the coding state prior to its insertion, and it establishes a predetermined coding state for the conversion of the next information word to be converted after after its insertion, and the sync words being mutually distinguishable on the basis of the logical values of bits at predetermined bit positions in a manner corresponding to the manner in which the sets of code words belonging to coding states of the second type are mutually distinguishable.

7. The method as claimed in claim 5, wherein p is equal to 2.

8. The method as claimed in claim 2, wherein d is equal to 2, k is equal to 10 and the ratio of n to m is 2:1.

9. The method as claimed in claim 8, wherein m is equal to 8, and n is equal to 16.

10. The method as claimed in claim 7, wherein the code words are made up of bits having a first logic value and bits having a second logic value, a first group of the first type of code words is formed by code words ending in a bits having the first logical value, where a is equal to 0 or 1, a second group of the first type of code words is formed by code words ending in b successive bits having the first logical value, where b is an integer greater than or equal to 6 and smaller than or equal to 9, a group of the second type is formed by code words ending in c successive bits having the first logical value, where c is an integer greater than or equal to 2 and smaller than or equal to 5, and the coding state related sets of code words from which the code words assigned to the information words are selected are formed by code words beginning with a number of bits of the first logical value, which number of bits depends on the coding state related to the set, so that the number of successive bits having the first logical value in a bit string formed by two successive code words is at least equal to d and at most equal to k.

11. A method for manufacturing a record carrier in which a modulated signal is generated by the method as claimed in claim 2 and the record carrier is then provided with an information pattern representing this signal.

12. A coding device, comprising an m-to-n bit converter for converting m-bit information words to n-bit code words, means for converting the n-bit code words to a modulated signal, and state establishing means for establishing a coding state on the delivery of a code word by the converter, the state establishing means being arranged for establishing a first type of coding state for each delivered code word belonging to a group of a first type, which state is determined only by the group to which the delivered code word belongs, and for establishing a second type of coding state for each of the delivered code words belonging to a group of the second type, which state is determined not only by the group to which the delivered code word belongs but also by information content in the information word converted into the delivered code word, wherein the m-to-n bit converter comprises means for selecting a code word corresponding to an information word from a set of code words belonging to the coding state of the first type or the second type established, sets of code words belonging to coding states of the second type containing no code words in common.

13. A coding device, comprising an m-to-n bit converter for converting m-bit information words to n-bit code words, means for converting the n-bit code words to a modulated signal, and state establishing means for establishing a coding state on the delivery of a code word by the converter, the state establishing means being arranged for establishing a first type of coding state for each delivered code word belonging to a group of a first type, which state is determined by the group from which the delivered code word belongs, and for establishing a second type of coding state for each of the delivered code words belonging to a group of the second type, which state is determined by the information word which is to be converted to the delivered code word, wherein the m-to-n bit converter comprises means for selecting a code word corresponding to an information word from a set of code words that depends on the coding state of the first type or the second type established, sets of code words belonging to coding states of the second type containing no code words in common, the device having bit cells and presenting substantially no frequency components in a low-frequency area in the frequency spectrum, wherein each minimum number of successive bit cells having the same signal value is d+1 and each maximum number k+1, the converter further comprises means for generating a pair of code words for each of at least a number of information words, and the device further comprises selecting means for selecting, for the code word delivery, either of the code words from the pairs in accordance with a predetermined criterion related to the low-frequency contents of the modulated signal.

14. The device as claimed in claim 13, further comprising means for determining a running digital sum value, which value denotes for a preceding part of the modulated signal the running value of a difference between the number of bit cells having a first signal value and the number of bit cells having a second signal value, wherein the pairs of code words comprising each at least two code words have opposite effects on the digital sum value, and the selecting means comprises means for selecting, according to a criterion depending on the digital sum value, those code words from the sets for which the digital sum value according to this criterion continues to be limited.

15. The device as claimed in claim 13, wherein the device is arranged for converting the information words to a series of code words which establish a bit string of bits having a first logical value and bits having a second logical value, the minimum number of successive bits having the first logical value located between bits having the second logical value being d and the maximum number being k, and the device further comprises a modulo-2 integrator for converting the bit string to the modulated signal.

16. The device as claimed in claim 13, wherein the sets of code words belonging to the coding states of the second type can be mutually distinguished on the basis of the logical values of bits at p predetermined bit positions in the code words, where p is an integer smaller than or equal to n.

17. The device as claimed in claim 16, further comprising means for inserting sync words into a bit string formed by the code words, the sync words displaying bit patterns that cannot occur in the bit string formed by the code words, means for selecting sync words to be inserted which have different bit patterns in dependence on the determined coding state, the sync words being mutually distinguishable on the basis of the logical values of bits at predetermined bit positions in a manner that corresponds to a manner in which the sets of code words belonging to the coding states of the second type can be mutually distinguished.

18. The device as claimed in claim 17, further comprising means for effecting a predetermined coding state once a sync word has been inserted.

19. The device as claimed in claim 16, wherein p is equal to 2.

20. A record carrier on which the signal as claimed in claim 19 is recorded in a track in which information patterns represent the signal portions, which information patterns comprise first and second parts alternating in the direction of the track, the first parts present detectable properties and the second parts present second properties distinguishable from the first properties, and the parts having the first properties represent bit cells having the first signal property and the parts having the second properties represent the bit cells having the second signal property.

21. The device as claimed in claim 13, wherein d is equal to 2, k is equal to 10, and the ratio of n to m is 2:1.

22. The device as claimed in claim 21, wherein m is equal to 8, and n is equal to 16.

23. The device as claimed in claim 21, wherein the code words are made up of bits having a first logic value and bits having a second logical value, a first group of the first type of code words is formed by code words ending in a bits having the first logical value, where a is equal to 0 or 1, a second group of the first type of code words is formed by code words ending in b successive bits having the first logical value, where b is an integer greater than or equal to 6 and smaller than or equal to 9, a group of the second type is formed by code words ending in c successive bits having the first logical value, where c is an integer greater than or equal to 2 and smaller than or equal to 5, and the coding state related sets of code words from which the code words assigned to the information words are selected are formed by code words beginning with a number of bits of the first logical value, which number of bits depends on the coding state related to the set, so that the number of successive bits having the first logical value in a bit string formed by two successive code words is at least equal to d and at most equal to k.

24. A device for recording information, which device comprises a coding device as claimed in claim 13 for converting a series of information words representing the information to a modulated signal, and means for recording on a record carrier an information pattern corresponding to the signal.

25. A coded signal modulated and stored on a record carrier and representing a series of information words for subsequent reading, demodulation and decoding to reproduce the represented series of information words, said coded signal comprising a sequence of q successive information signal portions which represent q information words, where q is an integer, in which signal each of the information signal portions represents one of the information words and comprises n bit cells, each said bit cell having a first or second signal property, each information signal portion belonging to one of a plurality of predetermined groups of information signal portions, each information signal portion belonging to a first one of said groups of information signal portions uniquely establishing an information word irrespective of information signal portions adjacent to said each information signal portion belonging to said first group, and each information signal portion belonging to a second one of said groups of information signal portions uniquely establishing an information word in dependence upon the value of at least one bit cell in an information signal portion adjacent to said each information signal portion belonging to said second group.

26. The signal as claimed in claim 24, wherein the first or second signal property is a first or second signal value, respectively, each number of successive bit cells having the same signal value is minimum d+1 and maximum k+1, and at any arbitrary point in the signal, the running value of the difference between the number of bit cells having the first signal value and the number of bit cells having the second signal value in the signal portion preceding that point is limited.

27. The signal as claimed in claim 26, wherein n is equal to 16, d is equal to 2, and k is equal to 10.

28. The signal as claimed in claim 25, wherein the signal comprises sync signal portions which have bit cell patterns that do not occur in the sequence of successive information signal portions, where a unique information word is established by each of the information signal portions of the second group combined with either an adjacent sync signal portion or an adjacent information signal portion.

29. The signal as claimed in claim 25, wherein the first or second signal property is a first or second signal value, respectively, and the presence or absence of changes of the signal value between pairs of successive bit cells at p predetermined bit cell transitions in each of the adjacent signal portions in combination with an information signal portion from the second group of information signal portions establish the information word to which that information signal portion corresponds, where p is an integer smaller than n.

30. The signal as claimed in claim 29, wherein p is equal to 2.

31. The signal as claimed in claim 25, wherein the first or second signal property is a first or second signal, respectively, the information signal portions from the predetermined group end in s bit cells having a same signal value, and the information signal portions from the second group end in t bit cells having the same signal value, where s can assume a number of different values, t can assume a number of different values, and s and t are different.

32. The signal as claimed in claim 31, wherein s is greater than or equal to 2, and smaller than or equal to 5.

33. A decoding device for converting the signal as claimed in claim 25 to a series of m-bit information words, the device comprising means for converting the signal to a bit string of bits having a first or second logical value, which bit string contains a series of n-bit code words which correspond to the information signal portions, and converting means for converting the series of code words to the series of information words, an information word being assigned to each of the code words to be converted and in dependence thereon, wherein the converting means are arranged for converting a code word to an information word also in dependence on the logical values of bits in the bit string which are located at p predetermined positions relative to the code word.

34. The decoding device as claimed in claim 33, wherein n is equal to 16, m is equal to 8, and p is equal to 2.

35. The decoding device as claimed in claim 34, wherein the p predetermined bit positions are the first and thirteenth bit position past the end of the code word.

36. The decoding device as claimed in claim 33, further comprising detection means for detecting sync words having bit patterns that cannot be formed by the successive code words in the series, or by a part of the sync word in combination with an adjacent code word.

37. The decoding device as claimed in claim 36, wherein the detection means are arranged for detecting 26-bit sync words corresponding to a bit pattern of "10010000000010000000001" or to a bit pattern of "00010000000001000000000001", where "0" represents a first logical value and where "1" represents a second logical value.

38. A reading device for reading a record carrier on which information is recorded in an information pattern, the device comprising means for converting the information pattern to a corresponding binary reading signal, and a decoding device as claimed in claim 33 for converting the binary reading signal to a series of m-bit information words.

* * * * *

US005696505C1

(12) EX PARTE REEXAMINATION CERTIFICATE (7103rd)
United States Patent
Immink

(10) Number: US 5,696,505 C1
(45) Certificate Issued: Oct. 13, 2009

(54) METHOD OF CONVERTING A SERIES OF M-BIT INFORMATION WORDS TO A MODULATED SIGNAL, METHOD OF PRODUCING A RECORD CARRIER, CODING DEVICE, DECODING DEVICE, RECORDING DEVICE, READING DEVICE, SIGNAL, AS WELL AS A RECORD CARRIER

(75) Inventor: Kornelis A. Schouhamer Immink, Eindhoven (NL)

(73) Assignee: U.S. Philips Corporation, New York, NY (US)

Reexamination Request:
No. 90/006,637, May 14, 2003

Reexamination Certificate for:
| | |
|---|---|
| Patent No.: | 5,696,505 |
| Issued: | Dec. 9, 1997 |
| Appl. No.: | 08/385,533 |
| Filed: | Feb. 8, 1995 |

(30) Foreign Application Priority Data

Feb. 15, 1994 (EP) .............................. 94200387

(51) Int. Cl.
| | |
|---|---|
| *H03M 5/00* | (2006.01) |
| *H03M 5/14* | (2006.01) |
| *G11B 20/14* | (2006.01) |
| *H04L 7/04* | (2006.01) |

(52) U.S. Cl. .......................................... 341/59; 341/95
(58) Field of Classification Search ................. 341/95, 341/58, 59, 106
See application file for complete search history.

(56) References Cited

U.S. PATENT DOCUMENTS

| | | | |
|---|---|---|---|
| 2,957,947 A | 10/1960 | Bowers | ...................... 179/15.6 |
| 3,855,426 A | 12/1974 | Bouwhis | ............... 179/100.3 V |

(Continued)

FOREIGN PATENT DOCUMENTS

| | | |
|---|---|---|
| DE | 3605396 A1 | 8/1987 |
| EP | 0059224 A1 | 9/1982 |

(Continued)

OTHER PUBLICATIONS

"A New Look–Ahead Code for Increasing Data Density," by Jacoby, G.V., IEEE Trans. Magn., vol. MAG–13, No. 5, pp. 1202–1204, Sep. 1977.

(Continued)

*Primary Examiner*—Eric S. Keasel

(57) ABSTRACT

A series of m-bit information words is converted to a modulated signal. For each information word from the series, an n-bit code word is delivered. The delivered code words are converted to the modulated signal. The code words are distributed over at least one group of a first type and at least one group of a second type. When a code word belonging to a group of the first type is delivered, its group establishes a coding state of a first type. When a code word belonging to an group of the second type is delivered, a coding state of a second type is established which is determined by the information word which is to be converted to the delivered code word. When one of the code words is assigned to the received information word, this code word is selected from a set of code words which depends on the coding state established. The sets of code words belonging to the coding states of the second type are disjunct. In this coding method, the number of unique bit combinations that may be established by the code words in the series are enlarged.

The modulated signal obtained may be reconverted to information words by first converting the modulated signal to a series of code words and then assigning an information word to each of the code words from the series in dependence on the code word to be converted and also in dependence on the logical values of the bit string bits which are situated at predetermined positions relative to the code word.

U.S. PATENT DOCUMENTS

| | | | |
|---|---|---|---|
| 4,020,282 A | 4/1977 | Halpern | 178/68 |
| 4,146,909 A | 3/1979 | Beckenhauer et al. | 360/39 |
| 4,261,019 A | 4/1981 | McClelland | 360/40 |
| 4,323,931 A | 4/1982 | Jacoby | 360/40 |
| 4,387,364 A | 6/1983 | Shirota | 340/347 DD |
| 4,410,877 A | 10/1983 | Carasso et al. | 340/347 DD |
| 4,413,251 A | 11/1983 | Adler et al. | 340/347 DD |
| 4,414,659 A | 11/1983 | Beckers | 369/59 |
| 4,437,086 A | 3/1984 | Miller et al. | 340/347 DD |
| 4,456,905 A | 6/1984 | Odaka | 340/347 DD |
| 4,463,344 A | 7/1984 | Adler et al. | 340/347 DD |
| 4,499,454 A | 2/1985 | Shimada | 340/347 |
| 4,501,000 A | 2/1985 | Immink et al. | 375/25 |
| 4,517,552 A | 5/1985 | Shirota et al. | 340/347 DD |
| 4,520,346 A | 5/1985 | Shimada | 340/347 DD |
| 4,536,742 A | 8/1985 | Schouhamer Immink | 340/347 DD |
| 4,539,691 A | 9/1985 | Ogawa | 375/37 |
| 4,573,034 A | 2/1986 | Schouhamer Immink | 340/347 DD |
| 4,617,526 A | 10/1986 | Hikawa et al. | 331/1 A |
| 4,620,311 A | 10/1986 | Schouhamer Immink | 375/19 |
| 4,641,128 A | 2/1987 | Schouhamer Immink | 340/347 DD |
| 4,675,650 A | 6/1987 | Coppersmith et al. | 340/347 DD |
| 4,683,572 A | 7/1987 | Baggen et al. | 371/37 |
| 4,697,167 A | 9/1987 | O'Keefe | 341/59 |
| 4,728,929 A | 3/1988 | Tanaka | 340/347 DD |
| 4,779,072 A | 10/1988 | Van Gestel | 341/59 |
| 4,811,361 A | 3/1989 | Bacou et al. | 371/37 |
| 4,833,470 A | 5/1989 | Iketani | 341/59 |
| 4,851,837 A | 7/1989 | Baldwin | 341/55 |
| 4,855,742 A | 8/1989 | Verboom | 341/102 |
| 4,988,999 A | 1/1991 | Uehara et al. | 341/59 |
| 5,016,258 A | 5/1991 | Tanaka et al. | 375/25 |
| 5,048,003 A | 9/1991 | Baggen et al. | 369/59 |
| 5,136,436 A | 8/1992 | Kahlman | 360/40 |
| 5,196,848 A | 3/1993 | Sakazaki | 341/58 |
| 5,198,813 A | 3/1993 | Isozaki | 341/59 |
| 5,206,646 A | 4/1993 | Sako et al. | 341/95 |
| 5,229,986 A | 7/1993 | Mizokami et al. | 369/59 |
| 5,241,309 A | 8/1993 | Cideciyan et al. | 341/59 |
| 5,333,126 A | 7/1994 | Fukuda et al. | 369/59 |
| 5,341,134 A | 8/1994 | Benjauthrit | 341/58 |
| 5,365,231 A | 11/1994 | Niimura | 341/58 |
| 5,375,249 A | 12/1994 | Cho | 395/800 |
| 5,451,943 A | 9/1995 | Satomura | 341/58 |
| 5,627,592 A | 5/1997 | Tichelaar et al. | 348/429 |
| 5,642,113 A | 6/1997 | Schouhamer Immink | 341/58 |
| 5,692,021 A | 11/1997 | Walker | 375/354 |
| 5,696,505 A | 12/1997 | Schouhamer Immink | 341/59 |
| 5,920,272 A | 7/1999 | Schouhamer Immink | 341/59 |

FOREIGN PATENT DOCUMENTS

| | | |
|---|---|---|
| EP | 0143005 A2 | 5/1985 |
| EP | 0193153 A2 | 9/1986 |
| EP | 0310041 A2 | 4/1989 |
| EP | 0347934 A2 | 12/1989 |
| EP | 0493044 A2 | 12/1991 |
| EP | 0506446 A1 | 9/1992 |
| GB | 2094107 A | 9/1982 |
| GB | 211805 A | 7/1983 |
| GB | 2141906 A | 1/1985 |
| GB | 2267416 | 1/1993 |
| JP | 062188073 | 8/1987 |
| JP | 62283719 | 12/1987 |
| JP | 63018822 | 1/1988 |
| JP | 63173274 | 7/1988 |
| JP | 02114724 | 4/1990 |
| JP | 04167624 | 6/1992 |

OTHER PUBLICATIONS

"A Rate of 2/3, (1, 6) RLL Code" by R.L. Adler, R.K. Brayton, M. Hassner, and B.P. Kitchens, IBM Techn. Discl. Bul., vol. 27,, pp. 4727–4729, 1985.

"A Rotary–head High–Density Digital Audio Tape Recorder" by H. Nakajima and K. Odaka, IEEE Trans. Consum. Electron., vol. CE–29, pp. 430–437, Aug. 1983.

"A Survey of Coding Schemes for Transmission or Recording of Digital Data" by H. Kobayashi, IEEE Trans. Commun., vol. COM–19, pp. 1087–1099, Dec. 1971.

"Algorithms for Sliding Block Codes. An Application of Symbolic Dynamics to Information Theory", by R.L. Adler, D. Coppersmith, and M. Hassner, IEEE Trans. Inform. Theory, vol. IT–29, No. 1, pp. 5–22, Jan. 1983.

"Alternative Modulation Codes for the Compact Disc" by C. French and J. Wolf, IEEE Trans. on Consum. Electron., Nov. 1988, vol. 34, No. 4, pp. 908–913.

"An Analysis Of DC Free Property On Run–Length Limited Code" by S. Tazaki, T. Kaji & H. Osawa 1986 Dummy Tijdschrift 1986 vol. 67 pp. 151–156.

"An Analysis Of DC Free Property On Run–Length Limited Code" Video audio and data recording sixth international conference Publ. No. 67 pp. 151–156 Publ. London UK 1986 214 pp. B04.

"Binary Code Suitable for Line Transmission" by J.M. Griffiths, Electronics Letters, vol. 5, pp. 79–81, 1969.

"Binary Two–thirds Rate Code with Full Word Look–Ahead" by G.V. Jacoby and R. Kost, IEEE Trans. Magn., vol. MAG–20, No. 5, pp. 709–714, Sep. 1984.

"Channel Codes for Digital Video Recording" by J.L.E. Baldwin, Institution of Electronic Radio and Engineers, Fifth International Conference on Video and Data Recording, University of Southampton, England, Apr. 1984, Proceedings No. 59, pp. 67–77.

"Coding Diagrams In Hard Disks" by Badell, C.M., Mundo Electron. (Spain), No. 184, pp. 63–64, 67, 68. May 1988.

"Coding for Constrained Channels: A Comparison of Two Approaches" by P.A. Franaszek, IBM J. Res. Develop., vol. 33, No. 6, 602–608, Nov .1989.

"Coding Techniques for Digital Recorders" by K.A. Schouhamer Immink, 1991, ISBN 0–13–140047–9.

"Constructions of Almost Block–Decodable Runlength–Limited Codes" by K.A.S. Immink, IEEE Trans. Inform. Theory, vol. 41, No. 1, pp. 284–287, Jan. 1995.

"Finite–State Modulation Codes for Data Storage", by B.H. Marcus, P.H. Siegel, and J.K. Wolf, IEEE Journal on Selected Areas in Communications, vol. 10, No. 1, pp. 5–37, Jan. 1992.

"Low–disparity Binary Coding System" by R.O. Carter, Electronics Letters, vol. 1, pp. 65–68, May 1965.

"Low–Frequency Suppression In RLL Codes For Optical Recording" by M. Mattavelli, Eight International Conference on Video, Audio and Data Recording. (Conf. Publ. No. 319), IEE, vii+182 PP.,pp. 109 15 1990.

"Mark Generation In 2, 7 Code", by H.J. Gardner and W. A. Overby. IBM Technical Disclosure Bulletin Dec. 1984 vol. 27, No. 7B pp. 4274–4277.

"Modulation and Coding for Information Storage" by P.H. Siegel and J.K. Wolf, IEEE Commun. Magazine, vol. 29, No. 12, pp. 68–86, Dec. 1991.

"Modulation Systems For Digital Audio Discs With Optical Readout", by KA Immink. ICASSP 81 proceedings of the 1981 IEEE Int. Conf. on Acoustics Speech and Signal Processing pp. 587–589.

"Optimal Codes for Digital Magnetic Recording" by J.C. Mallinson and J.W. Miller, Radio and Elec. Eng, vol. 47, pp. 172–176, 1977.

"Optimization Of Low–Frequency Properties Of Eight–To–Fourteen Modulation" by K.A. Schouhamer Immink, U. Gross. Radio & Electron. Eng. (GB), vol. 53, No. 2, pp. 63–66, Feb. 1983.

"Prefix–Synchronized Run–Length–Limited Sequences" by K.A.S. Immink, H. Hollmann, IEEE on Selected Areas in Communications, vol. 10, No. 1, Jan. 1992, p. 214–222.

"Principles of Digital Line Coding" by K. Cattermole, Int. J. Electron., vol. 55, pp. 3–33, Jul. 1983.

"Recording Codes for Digital Magnetic Storage" by P.H. Siegel, IEEE Trans. Magn., vol. MAG–21, No. 5, pp. 1344–1349, Sep. 1985.

"Run–Length Reduction of 3PM Code via Look–Ahead Technique" by M. Cohn and G.V. Jacoby, IEEE Trans. Magn., vol. MAG–18, pp. 1253–1255, Nov. 1982.

"Sliding–Block Coding for Input–Restricted Channels" by R. Karabed and B.H. Marcus, IEEE Trans. Inform. Theory, vol. IT–34, No. 1, pp. 2–26, Jan. 1988.

"The EFM Recording Code" by Dusek, K., Sdelovaci Tech. (Czechoslovakia), vol. 32, No. 5, pp. 177–178, May 1984.

"Waveform Compression in NRZI Magnetic Recording" by M. Berkoff, Proceedings. IEEE, vol. 52, pp. 1271–1272, Oct. 1964.

"Zero–Modulation Encoding in Magnetic Recording" by A.M. Patel, IBM J. Res. Develop., vol. 19, pp. 366–378, Jul. 1975.

"Other Invention Disclosure Statement" May 8, 2003.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 2–4, 8, 9, and 11 is confirmed.

Claims 1, 12, 20, and 25–38 are cancelled.

Claims 5, 6, 10, 13, 16, and 23 are determined to be patentable as amended.

Claims 7, 14, 15, 17–19, 21, 22, and 24, dependent on an amended claim, are determined to be patentable.

New claims 39–50 are added and determined to be patentable.

5. The method as claimed in claim 2, wherein the code words are made up of bits having first and second [logic] *logical* values, and the sets of code words belonging to the coding states of the second type can be mutually distinguished on the basis of the logical values of bits at p predetermined bit positions in the code words, where p is an integer smaller than n.

6. The method as claimed in claim 5, wherein sync words are inserted into the series of code words, the sync words showing bit patterns that cannot occur in a bit string formed by the code words and having different bit patterns, the sync word being used depends on the coding state prior to its insertion, and it establishes a predetermined coding state for the conversion of the next information word to be converted after [after] its insertion, and the sync words being mutually distinguishable on the basis of the logical values of bits at predetermined bit positions in a manner corresponding to the manner in which the sets of code words belonging to coding states of the second type are mutually distinguishable.

10. The method as claimed in claim 7, wherein the code words are made up of bits having a first [logic] *logical* value and bits having a second [logic] *logical* value, a first group of the first type of code words is formed by code words ending in a bits having the first logical value, where a is equal to 0 or 1, a second group of the first type of code words is formed by code words ending in b successive bits having the first logical value, where b is an integer greater than or equal to 6 and smaller than or equal to 9, a group of the second type is formed by code words ending in c successive bits having the first logical value, where c is an integer greater than or equal to 2 and smaller than or equal to 5, and the coding state related sets of code words from which the code words assigned to the information words are selected are formed by code words beginning with a number of bits of the first logical value, which number of bits depends on the coding state related to the set, so that the number of successive bits having the first logical value in a bit string formed by two successive code words is at least equal to d and at most equal to k.

13. A coding device, comprising an m-to-n bit converter for converting m-bit information words to n-bit code words, means for converting the n-bit code words to a modulated signal, and state establishing means for establishing a coding state on the delivery of a code word by the converter, the state establishing means being arranged for establishing a first type of coding state for each delivered code word belonging to a group of a first type, which state is determined by the group from which the delivered code word belongs, and for establishing a second type of coding state for each of the delivered code words belonging to a group of the second type, which state is determined by the information word which is to be converted to the delivered code word, wherein the m-to-n bit converter comprises means for selecting a code word corresponding to an information word from a set of code words that depends on the coding state of the first type or the second type established, sets of code words belonging to coding states of the second type containing no code words in common, the [device] *modulated signal* having bit cells and presenting substantially no frequency components in a low-frequency area in the frequency spectrum, wherein each minimum number of successive bit cells having the same signal value is d+1 and each maximum number is k+1, the converter further comprises means for generating a pair of code words for each of at least a number of information words, and the device further comprises selecting means for selecting, for the code word delivery, either of the code words from the pairs in accordance with a predetermined criterion related to the low-frequency contents of the modulated signal.

16. The device as claimed in claim 13, wherein the sets of code words belonging to the coding states of the second type can be mutually distinguished on the basis of the logical values of bits at p predetermined bit positions in the code words, where p is an integer smaller than [or equal to] n.

23. The device as claimed in claim [21] *13*, wherein the code words are made up of bits having a first [logic] *logical* value and bits having a second logical value, a first group of the first type of code words is formed by code words ending in a bits having the first logical value, where a is equal to 0 or 1, a second group of the first type of code words is formed by code words ending in b successive bits having the first logical value, where b is an integer greater than or equal to 6 and smaller than or equal to 9, a group of the second type is formed by code words ending in c successive bits having the first logical value, where c is an integer greater than or equal to 2 and smaller than or equal to 5, and the coding state related sets of code words from which the code words assigned to the information words are selected are formed by code words beginning with a number of bits of the first logical value, which number of bits depends on the coding state related to the set, so that the number of successive bits having the first logical value in a bit string formed by two successive code words is at least equal to d and at most equal to k.

*39. The method of claim 7, wherein the p predetermined bit positions are the first and thirteenth bit position.*

*40. The device of claim 19, wherein the p predetermined bit positions are the first and thirteenth bit position.*

*41. The method of claim 5 in which the p bit positions are non-consecutive.*

*42. The device of claim 16 in which the p bit positions are non-consecutive.*

*43. The method of claim 2, wherein the code words of the group of the first type end in s bits having a same logical* value, and the code words of the group of the second type end in t bits having a same logical value, where s can assume a number of different values, t can assume a number of different values, and the values that s can assume are all different than the values that t can assume.

44. The method of claim 13, wherein the code words from a first group end in s bits having a same logical value, and the code words from a second group end in t bits having the same logical value, where s can assume a number of different values, t can assume a number of different values, and the values that s can assume are all different than the values that t can assume.

45. The method of claim 2, wherein:
the predetermined criteria of the modulated signal includes, a minimum run length of d+1 and a maximum run length of k+1 for a same signal value within the bit cells of the modulated signal representing each code word;
the same minimum run length and maximum run length in the modulated signal applies within each code word representation as well as across boundaries of sequential code word representations in the modulated signal.

46. The device of claim 13, wherein:
the predetermined criteria of the modulated signal includes, a minimum run length of d+1 and a maximum run length of k+1 for a same signal value within the bit cells of the modulated signal representing each code word;
the same minimum run length and maximum run length in the modulated signal applies within each code word representation as well as across boundaries of sequential code word representations in the modulated signal.

47. The method of claim 2, wherein
the code words are made up of bits having first and second logical values, and
the code words contained in different sets associated with the coding states of the second type are mutually distinguishable based on the logical values of bits at p predetermined bit positions in the code words, where p is an integer smaller than n.

48. The method of claim 5, wherein
sync words are inserted into the series of code words,
the sync words including a plurality of different sync words with different respective bit patterns;
the sync words having bit patterns that cannot occur in a bit string formed by the code words,
the inserted sync word selected from the plurality of different sync words depending on the coding state prior to its insertion, and the inserted sync word establishes a same predetermined coding state for the conversion of the next information word to be converted after the sync word's insertion, and
the different sync words being mutually distinguishable on the basis of the logical values of bits at predetermined bit positions in a manner corresponding to the manner in which code words contained in different sets associated with the coding states of the second type are mutually distinguishable.

49. The device of claim 13, wherein code words contained in different sets associated with the coding states of the second type are mutually distinguishable based on the logical values of bits a p predetermined bit positions in the code words, where p is an integer smaller than n.

50. The device of claim 13, further comprising
means for inserting sync words into a bit string formed by the code words, the sync words having bit patterns that cannot occur in the bit string formed by the code words,
means for selecting mutually different sync words to be inserted which have different bit patterns depending on the established coding state, the sync words being mutually distinguishable on the basis of the logical values of bits at predetermined bit positions in a manner that corresponds to the manner in which code words contained in different sets associated with the coding states of the second type are mutually distinguishable;
the different sync words establishing a same predetermined coding state for the conversion of the next information word to be converted.

* * * * *